US012588547B2

(12) United States Patent　　　　　(10) Patent No.:　US 12,588,547 B2
Chen et al.　　　　　　　　　　　　　(45) Date of Patent:　　Mar. 24, 2026

(54) ELECTRONIC DEVICE AND MANUFACTURING METHOD THEREOF

(71) Applicant: InnoLux Corporation, Miao-Li County (TW)

(72) Inventors: Sheng-Nan Chen, Miao-Li County (TW); Chia-Lin Yang, Miao-Li County (TW); Kuan-Feng Lee, Miao-Li County (TW); Jui-Jen Yueh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 651 days.

(21) Appl. No.: 17/959,314

(22) Filed: Oct. 4, 2022

(65) Prior Publication Data

US 2024/0047288 A1　　Feb. 8, 2024

(30) Foreign Application Priority Data

Aug. 5, 2022　(CN) ......................... 202210939507.8

(51) Int. Cl.
H01L 23/29　　　(2006.01)
H01L 21/48　　　(2006.01)
(Continued)

(52) U.S. Cl.
CPC ........ H01L 23/293 (2013.01); H01L 21/4857 (2013.01); H01L 21/486 (2013.01);
(Continued)

(58) Field of Classification Search
CPC ............... H01L 23/293; H01L 23/3135; H01L 23/5389; H01L 23/3107; H01L 23/562; H01L 23/564; H01L 25/0655; H01L 25/072; H01L 23/315; H01L 21/4857; H01L 21/486; H01L 21/563; H01L 21/566; H01L 23/3142; H01L 23/49833; H01L 23/49838; H01L 23/5383; H01L 23/5386; H01L 24/16; H01L 24/19; H01L 24/24; H01L 23/3121; H01L 2224/16227;
(Continued)

(56) References Cited

U.S. PATENT DOCUMENTS 9,349,684 B2　5/2016　Kim
2020/0176385 A1*　6/2020　Sung ..................... H01L 23/145
(Continued)

FOREIGN PATENT DOCUMENTS

TW　　　　I543272　　　7/2016
TW　　　　I576969　　　4/2017
TW　　　202224507 A　　6/2022

*Primary Examiner* — Evan G Clinton
(74) *Attorney, Agent, or Firm* — Winston Hsu

(57) ABSTRACT

The present disclosure provides an electronic device including a first electronic unit, a second electronic unit, a circuit layer, a protection layer, and a flexible member. The first electronic unit is electrically connected to the second electronic unit through the circuit layer. The protection layer is disposed corresponding to the first electronic unit and the second electronic unit, and the protection layer has an opening. At least a portion of the flexible member is disposed in the opening. The protection layer has a first Young's modulus, the flexible member has a second Young's modulus, and the first Young's modulus is greater than the second Young's modulus.

11 Claims, 15 Drawing Sheets

(51) Int. Cl.
| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |

(52) U.S. Cl.
CPC .......... *H01L 21/563* (2013.01); *H01L 21/566* (2013.01); *H01L 23/3135* (2013.01); *H01L 23/3142* (2013.01); *H01L 23/49833* (2013.01); *H01L 23/49838* (2013.01); *H01L 23/5383* (2013.01); *H01L 23/5386* (2013.01); *H01L 24/16* (2013.01); *H01L 24/19* (2013.01); *H01L 24/24* (2013.01); *H01L 23/3121* (2013.01); *H01L 2224/16227* (2013.01); *H01L 2224/16237* (2013.01); *H01L 2224/24011* (2013.01); *H01L 2224/24051* (2013.01); *H01L 2224/24101* (2013.01); *H01L 2224/24137* (2013.01); *H01L 2924/1811* (2013.01); *H01L 2924/1815* (2013.01); *H01L 2924/182* (2013.01); *H01L 2924/18301* (2013.01); *H01L 2924/186* (2013.01)

(58) Field of Classification Search
CPC . H01L 2224/16237; H01L 2224/24011; H01L 2224/24051; H01L 2224/24101; H01L 2224/24137; H01L 2924/1811; H01L 2924/1815; H01L 2924/182; H01L 2924/18301; H01L 2924/186; H01L 2221/68345; H01L 2221/68359; H01L 21/6835; H01L 23/3677; H01L 24/81; H01L 25/16

See application file for complete search history.

(56) References Cited

U.S. PATENT DOCUMENTS

| | | | |
|---|---|---|---|
| 2021/0035859 A1* | 2/2021 | Mehta | H01L 23/3135 |
| 2021/0288035 A1* | 9/2021 | Liljeberg | H01L 24/17 |
| 2022/0068856 A1* | 3/2022 | Chiou | H01L 23/3135 |
| 2023/0041709 A1* | 2/2023 | Hsu | H01L 25/0753 |

* cited by examiner

ELECTRONIC DEVICE AND MANUFACTURING METHOD THEREOF

BACKGROUND OF THE DISCLOSURE

1. Field of the Disclosure

The present disclosure relates to an electronic device and a manufacturing method thereof, and more particularly to a bendable electronic device including electronic units and a manufacturing method thereof.

2. Description of the Prior Art

In order to integrate various functions to meet different usage requirements, it has been developed that a plurality of chips are encapsulated in one package device by an encapsulant material. In conventional packaging technology, since the encapsulant material has a rigid property after being heated, the chips can be protected from damage during manufacturing processes or using processes. However, because of the limit of the rigid encapsulant material, the package device cannot be bent, thereby limiting applications of the package device.

SUMMARY OF THE DISCLOSURE

According to an embodiment, the present disclosure provides an electronic device, which includes a first electronic unit, a second electronic unit, a circuit layer, a protection layer, and a flexible member. The first electronic unit is electrically connected to the second electronic unit through the circuit layer. The protection layer is disposed corresponding to the first electronic unit and the second electronic unit, and the protection layer has an opening. At least a portion of the flexible member is disposed in the opening. The protection layer has a first Young's modulus, the flexible member has a second Young's modulus, and the first Young's modulus is greater than the second Young's modulus.

According to another embodiment, the present disclosure provides an electronic device, which includes a first electronic unit, a second electronic unit, a circuit layer, and a flexible member. The first electronic unit is electrically connected to the second electronic unit through the circuit layer. The flexible member at least surrounds the first electronic unit and the second electronic unit, in which a surface of the flexible member directly contacts the circuit layer.

According to another embodiment, the present disclosure provides a manufacturing method of an electronic device. First, a carrier is provided. Then, a first electronic unit and a second electronic unit are disposed on the carrier. Next, a protection layer is formed on the carrier, wherein the protection layer is disposed corresponding to the first electronic unit and the second electronic unit and has an opening. After that, a flexible member is formed on the carrier, wherein at least a portion of the flexible member is disposed in the opening. Then, a circuit layer is formed on the first electronic unit, the second electronic unit, the protection layer and the flexible member, wherein the first electronic unit is electrically connected to the second electronic unit through the circuit layer. The protection layer has a first Young's modulus, the flexible member has a second Young's modulus, and the first Young's modulus is greater than the second Young's modulus.

These and other objectives of the present disclosure will no doubt become obvious to those of ordinary skill in the art after reading the following detailed description of the embodiment that is illustrated in the various figures and drawings.

DETAILED DESCRIPTION

Figure 1:
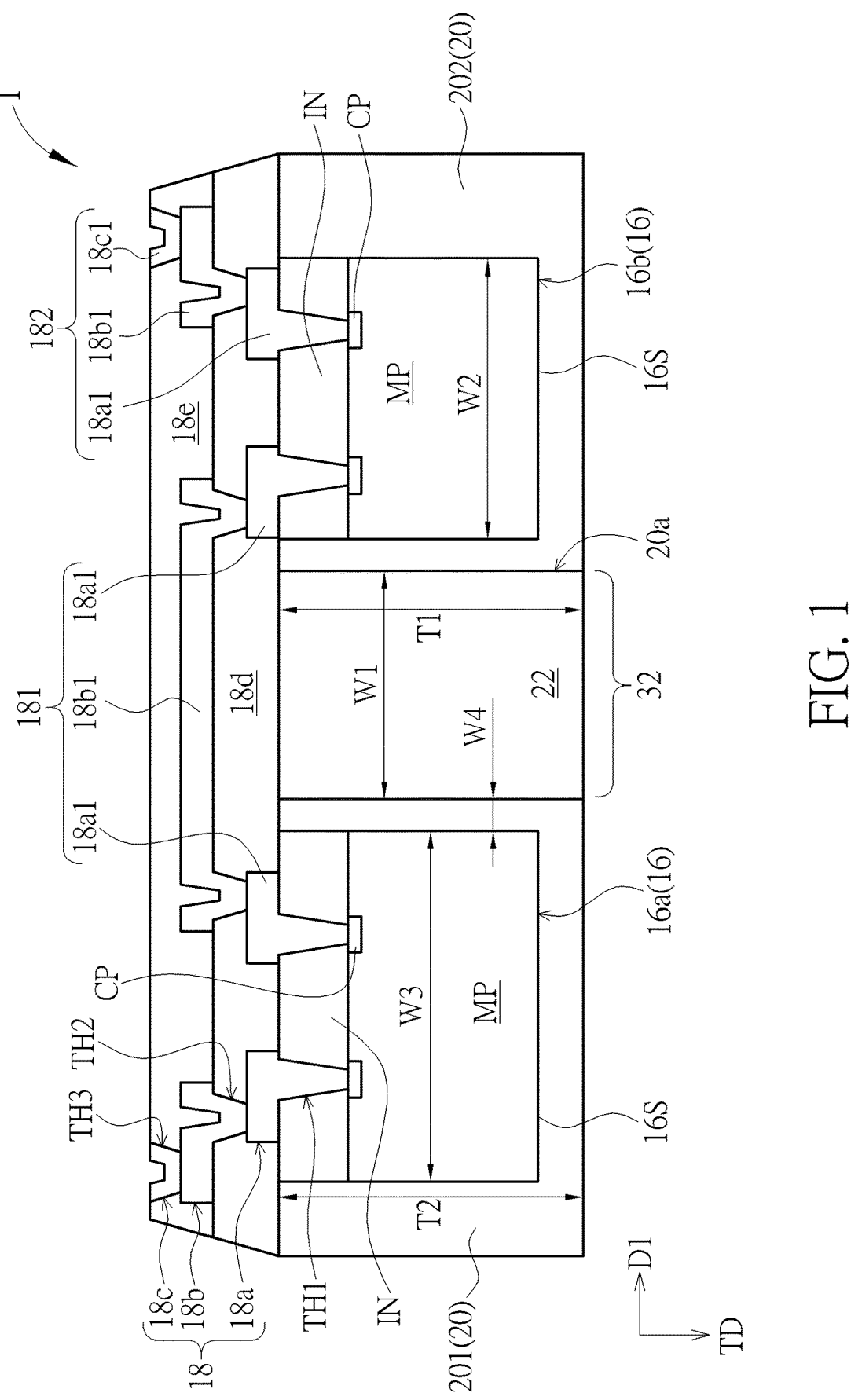
FIG. 1 is a schematic cross-sectional view of an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name. Thus, a first element mentioned in the specification may be called a second element.

Spatially relative terms, such as "above", "on", "beneath", "below", "under", "left", "right", "before", "front", "after", "behind" and the like, used in the following embodiments just refer to the directions in the drawings and are not intended to limit the present disclosure. It may be understood that the elements in the drawings may be disposed in any kind of formation known by those skilled in the related art to describe or illustrate the elements in a certain way. Furthermore, when one element is mentioned to overlap another element, it may be understood that the element may partially or completely overlap the another element.

In addition, when one element or layer is called "on" or "above" another element or layer, or called "connected to" another element or layer, it may be understood that the element or layer is directly on the another element or layer, or the element or layer is directly connected to the another element or layer, and alternatively, another element or layer may be between the one element or layer and the another element or layer (indirectly). On the contrary, when the element or layer is called "directly on" the another element or layer, there is no intervening element or layer between the element or layer and the another element or layer. Furthermore, the term "electrically connected to" or "coupled to" may include any directly or indirectly electrical connection.

As disclosed herein, the terms "approximately", "essentially", "about", "substantially", and "same" generally mean within 10%, 5%, 3%, 2%, 1%, or 0.5% of the reported numerical value or range. The quantity disclosed herein is an approximate quantity, that is, without a specific description of "approximately", "essentially", "about", "substantially", and "same", the quantity may still include the meaning of "approximately", "essentially", "about", "substantially", and "same".

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, width, thickness, and height may be measured by using an optical microscope (OM), a scanning electron microscope (SEM), or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

In the present disclosure, the electronic device may be a bendable or flexible electronic device, but not limited thereto. The electronic device may for example include a semiconductor package device, a light-emitting device, a sensing device, a display device, an antenna device, a touch electronic device (touch display), a curved electronic device (curved display), a tiled electronic device or a free shape electronic device (free shape display), but not limited thereto. Electronic units in the electronic device may include a passive element and an active element and for example may include an integrated circuit, a capacitor, a resistor, an inductor, a diode, a transistor, etc. The diode may for example include a light emitting diode (LED) or a photo-diode. The sensing device may for example be used for sensing capacitance variance, light, heat or ultrasound, but not limited thereto. The display device may for example include light emitting diode, quantum dot material, a fluo-rescent material, a phosphor material, other suitable display mediums, or any combination thereof, but not limited thereto. The LED may for example include organic light emitting diode (OLED), mini light emitting diode (mini-LED), micro light emitting diode (micro-LED), or quantum dot light emitting diode (e.g., QLED or QDLED), other suitable materials, or any combination thereof, but not limited thereto. The display device may for example a tiled display device, but not limited thereto. The antenna device may be for example a liquid crystal antenna or other types of antenna, but not limited thereto. The antenna device may for example include a tiled antenna device, but not limited thereto. In addition, the appearance of the electronic device may be rectangular, circular, polygonal, a shape with curved edges, curved or other suitable shapes, but not limited thereto. The electronic device may optionally have periph-eral systems such as a driving system, a control system, a light source system, a shelf system, etc. It is noted that the electronic device may be any combination of the devices mentioned above, but not limited thereto.

Please refer to FIG. 1, which is a schematic cross-sectional view of an electronic device according to a first embodiment of the present disclosure. As shown in FIG. 1, the electronic device 1 may include two electronic units 16, a circuit layer 18, a protection layer 20 and a flexible member 22, wherein the two electronic units 16 may be electrically connected to each other through the circuit layer 18, the protection layer 20 may be disposed corresponding to the two electronic units 16 and may have an opening 20a, and at least a portion of the flexible member 22 may be disposed in the opening 20a. It should be noted that the protection layer 20 may have a first Young's modulus, the flexible member 22 may have a second Young's modulus, and the first Young's modulus is greater than the second Young's modulus. Accordingly, the electronic device 1 may have a bendable or flexible property, so that application field of the electronic device 1 may be improved.

Specifically, the protection layer 20 may surround the electronic units 16, or the protection layer 20 may contact at least one surface of one of the electronic units 16. The protection layer may be used to protect the electronic units 16, for example, to reduce or prevent the electronic units 16 from being affected by moisture or oxygen and/or to reduce or prevent the electronic units 16 from being scratched or damaged by foreign objects. As compared with the protec-tion layer 20, the flexible member 22 may have less Young's modulus so as to have greater flexibility. By disposing the flexible member 22 in a region of the electronic device 1 without corresponding to the electronic units 16, the elec-tronic device 1 may have the bendable or flexible property. In other words, the electronic device 1 may have a bendable region 32, and the opening 20a may be located in the bendable region 32, so that a portion of the electronic device 1 located in the bendable region 32 may be bent or flexed. For example, when the electronic device 1 is not bent, the bendable region 32 may not overlap the electronic units 16 in a top view direction TD of the electronic device 1. In addition, by disposing the protection layer 20 in a region of the electronic device 1 corresponding to the electronic units 16, the electronic units 16 may be protected when the electronic device 1 has the bendable or flexible property. The top view direction TD of the electronic device 1 may be, for example, a direction of stacking insulating layers of the circuit layer 18 (e.g., an insulating layer 18d and an insulating layer 18e).

For example, the Young's modulus of the flexible member 22 may be 0.3 gigapascals (Gpa) to 4 Gpa (i.e., 0.3 Gpa the Young's modulus of the flexible member 22≤4 Gpa). The flexible member 22 may include, for example, polyimide (PI) with the Young's modulus of 3.3 GPa, polycarbonate (PC) with the Young's modulus of 2.5 GPa, and polyurethane (PU) with the Young's modulus of 0.36 GPa or other suitable flexible materials, or the flexible member 22 may be for example composed of at least one of the flexible materials mentioned above. When the Young's modulus of the flexible member 22 is smaller, for example 0.36 GPa, the electronic device 1 may have a stretchable property, for example. The Young's modulus of the protection layer 20 may be for example greater than 4 GPa (i.e., 4 Gpa<the Young's modulus of the protection layer 20). The protection layer 20 may for example include epoxy resin with the Young's modulus of 4.9 GPa, epoxy molding compound (EMC) with higher Young's modulus, other suitable packaging materials, or any combination of the mentioned above, but not limited thereto. In some embodiments, the flexible member 22 may include organic materials and/or inorganic materials, but not limited thereto.

According to some embodiments, the Young's modulus of the present disclosure may be measured by, for example, a universal testing machine, but the method for measuring the Young's modulus is not limited thereto. For example, the universal testing machine is used to test a relation between deformation amount and load of the flexible member 22 or the protection layer 20, and the Young's modulus may be obtained by converting the test result. For example, a sample of the flexible member 22 or the protection layer 20 (e.g., millimeters (mm)×40 mm×1 mm) is placed on the test tool of the universal testing machine, and the universal testing machine is pressed in a moving speed of 5 millimeters per minute (mm/min), so that an indenter of the universal testing machine presses the flexible member 22 or the protection layer 20 until the sample of the flexible member 22 or the protection layer 20 is broken or the load of the sample of the flexible member 22, or the protection layer is reduced by 10%, or the Young's modulus of the flexible member 22 or the protection layer 20 may be obtained by using a look-up table, but not limited thereto.

The electronics units 16 may for example include active chips, passive elements, package elements, or other suitable elements that having an active element and/or a passive element. The electronic units 16 may be, for example, semiconductor dies or known-good dies (KGD), system in package (SiP) elements, diode chips, or other similar elements. The diode chips may include for example mini LEDs, micro LEDs, or OLEDs.

In the embodiment of FIG. 1, the electronic units 16 are semiconductor chips as an example, and each of the electronic units 16 may include a plurality of pads CP for being electrically connected to other elements. The pads CP may be for example signal output/input pads of the corresponding electronic unit 16. Herein, the electronic units 16 include the first electronic unit 16a and the second electronic unit 16b as an example for detailed description, but not limited thereto. The pads CP of the first electronic unit 16a and the pads CP of the second electronic unit 16b may be disposed facing the circuit layer 18, so that the circuit layer 18 may be directly electrically connected to the first electronic unit 16a and the second electronic unit 16b, but the present disclosure is not limited thereto. In the embodiment of FIG. 1, each of the electronic units 16 may further include a main portion MP and an insulating layer IN, wherein the pads CP may be disposed on the main portion MP, and the insulating layer IN may be disposed on the pads CP and the main portion MP and may have a plurality of through holes TH1 respectively exposing the pads CP. The types or structures of the electronic units of the present disclosure are not limited to that shown in FIG. 1.

Figure 5:
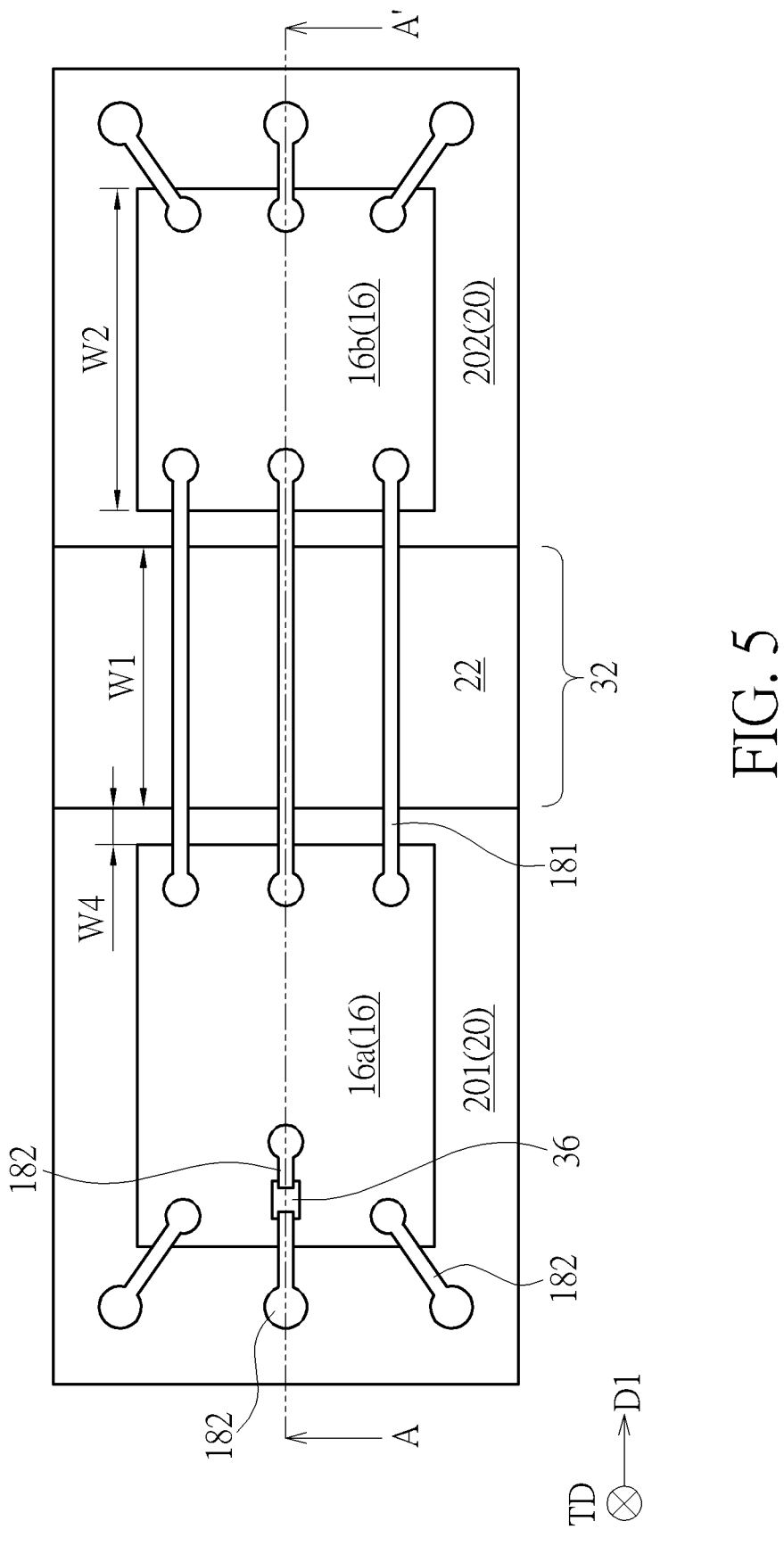
FIG. 5 is a schematic top view of an electronic device according to some embodiments of the present disclosure.

As shown in FIG. 1, the protection layer 20 may include a first portion 201 disposed corresponding to the first electronic unit 16a and a second portion 202 disposed corresponding to the second electronic unit 16b. The term "an element disposed corresponding to the electronic unit" mentioned herein may be referred to as the element contacting at least one surface of the electronic unit 16, for example, as the element contacting at least two sidewalls of the electronic unit 16 in a cross-sectional view. Specifically, the first portion 201 may be in contact with two opposite sidewalls of the first electronic unit 16a, and the second portion 202 may be in contact with two opposite sidewalls of the second electronic unit 16b, so that the first portion 201 may at least surround the first electronic unit 16b, and the second portion 202 may at least surround the second electronic unit 16b (e.g., as shown in FIG. 5), but not limited thereto. In the embodiment of FIG. 1, the first portion 201 and the second portion 202 may be further disposed on a back surface 16S of the first electronic unit 16a opposite to the pads CP and a back surface 16S of the second electronic unit 16b opposite to the pads CP, but not limited thereto. In some embodiments, the protection layer 20 on the back surfaces 16S of the first electronic unit 16a and the second electronic unit 16b may be removed to expose the back surfaces 16S of the first electronic unit 16a and the second electronic unit 16b, thereby facilitating heat dissipation of the first electronic unit 16a and the second electronic unit 16b, but not limited thereto.

In the embodiment of FIG. 1, the opening 20a of the protection layer 20 may separate the first portion 201 from the second portion 202, so that the flexible member 22 disposed in the opening 20a may separate the first portion 201 from the second portion 202, but not limited thereto. For example, in the direction D1, a portion of the flexible member 22 may be disposed between the first portion 201 and the second portion 202. In some embodiments, the opening 20a may be for example a through hole penetrating the protection layer 20 or a groove without penetrating through the protection layer 20. In other words, in the top view direction TD of the electronic device 1, a thickness T1 of the flexible member 22 disposed in the opening 20a may be less than or equal to the thickness T2 of the protection layer 20, but not limited thereto. The thickness T1 of the flexible member 22 and the thickness T2 of the protection layer 20 may be obtained by exposing a cross-section of the electronic device 1 along a direction parallel to the top view direction TD through cutting or other methods and performing measurement through an optical microscope, an electron microscope or other suitable measuring methods.

In some embodiments, the first electronic unit 16a and the second electronic unit 16b may be arranged in the direction D1, and in the direction D1, when a width of one of the first electronic unit 16a and the second electronic unit 16b is less than that of another one of the first electronic unit 16a and the second electronic unit 16b, the width W1 of the flexible member 22 may be greater than or equal to a half of the width of the one of the first electronic unit 16a and the second electronic unit 16b, so that the flexible member 22 may have sufficient width W1 that allows the electronic device 1 to fold or bend, but not limited thereto. For example, when a width W2 of the second electronic unit 16b is less than a width W3 of the first electronic unit 16a, the width W1 of the flexible member 22 may be greater than or equal to a half of the width W2 of the second electronic unit 16b in the direction D1 (i.e., (the width W2 of the second electronic unit 16b)/2 the width W1 of the flexible member 22). In some embodiments, in the direction D1, a width of a portion of the protection layer 20 between the first electronic unit 16a and the flexible member 22 or between the second electronic unit 16b and the flexible member 22 (e.g., a width W4) may be greater than 0 and less than or equal to one third of the width W1 of the flexible member 22 (i.e., 0<the width W4≤(the width W1 of the flexible member 22)/3), but not limited thereto. The direction D1 may be, for example, perpendicular to the top-view direction TD of the electronic device 1.

In some embodiments, a thermal conductivity of the protection layer 20 may be less than a thermal conductivity of the flexible member 22 (i.e., the thermal conductivity of the protection layer 20<the thermal conductivity of the flexible member 22), so that the flexible member 22 may facilitate heat dissipation of the electronic unit 16, but not limited thereto. For example, the thermal conductivity of a material of the protection layer 20 may be, for example, 0.19 $W·m^{-1}·K^{-1}$, and the thermal conductivity of a material of the flexible member 22 may be, for example, 0.37 $W·m^{-1}·K^{-1}$, but not limited thereto. In some embodiments, the flexible member 22 may further include thermally conductive particles to improve heat dissipation, but not limited thereto. The thermally conductive particles may include, for example, metal oxides or other suitable materials.

The circuit layer 18 may be, for example, a redistribution layer or other type of circuit layer. The circuit layer 18 may be used to electrically connect the electronic units 16 to other elements outside. The circuit layer 18 may include at least one conductive layer and at least one insulating layer. In this embodiment, the circuit layer 18 may include a plurality of conductive layers and a plurality of insulating layers, wherein at least one of the insulating layers may have a third Young's modulus, and the first Young's modulus may be greater than the third Young's modulus, such that the circuit layer 18 may have the bendable and flexible property. The insulating layers may include, for example, organic materials and/or inorganic materials. For example, the insulating layers may include polyimide (PI), photosensitive polyimide (PSPI), or other suitable dielectric materials. The conductive layers may include metal materials such as copper (Cu), titanium (Ti), aluminum (Al), molybdenum (Mo), nickel (Ni), other metals, or any combination thereof, but not limited thereto.

One of the insulating layers may have at least one through hole (e.g., a through hole TH2 and/or a through hole TH3), and at least one of the conductive layers may be electrically connected to one of the first electronic unit 16a and the second electronic unit 16b through the through hole, but not limited thereto. In other words, the conductive layer in the circuit layer 18 may for example form a plurality of conductive lines (e.g., a conductive line 181 and conductive lines 182 in FIG. 1) electrically connected to the same or different pads CP through the through holes in the insulating layers. For example, in the circuit layer 18 of FIG. 1, the conductive layers may include a conductive layer 18a, a conductive layer 18b and a conductive layer 18c, and the insulating layers may include an insulating layer 18d and an insulating layer 18e, but the number of conductive layers and the number of insulating layers of the circuit layer 18 in the present disclosure are not limited to those shown in FIG. 1. The conductive layer 18a may be disposed on the first electronic unit 16a and the second electronic unit 16b. The conductive layer 18a may include, for example, a plurality of traces 18a1, wherein at least one of the traces 18a1 may be electrically connected to the first electronic unit 16a, and at least another one of the traces 18a1 may be electrically connected to the second electronic unit 16b. In some embodiments, a portion of the conductive layer 18a may be disposed on the flexible member 22 and/or the protection layer 20. In the embodiment of FIG. 1, the traces 18a1 may extend into the corresponding through holes TH1 to be electrically connected to the corresponding first electronic unit 16a or the corresponding second electronic unit 16b, but not limited thereto. The insulating layer 18d may be disposed on the first electronic unit 16a, the second electronic unit 16b, the protection layer 20, the flexible member 22 and the conductive layer 18a. For example, the insulating layer 18d may have a plurality of through holes TH2 exposing the corresponding traces 18a1. The conductive layer 18b may be disposed on the insulating layer 18d. The conductive layer 18b may include, for example, a plurality of traces 18b1 disposed on the insulating layer 18d and extend into the corresponding through holes TH2 to be electrically connected to the corresponding traces 18a1. The insulating layer 18e may be disposed on the conductive layer 18b. For example, the insulating layer 18e may have a plurality of through holes TH3 exposing the corresponding traces 18b1. The conductive layer 18c may be disposed in the through holes TH3. The conductive layer 18c may include, for example, a plurality of pads 18c1 respectively disposed in the corresponding through holes TH3 and electrically connected to the corresponding traces 18b1, and the pads 18c1 may be used to be electrically connected to other external elements. The pad 18c1 may for example be under-bump metallization (UBM) or other suitable structures. The pad 18c1 may be, for example, a single-layer or multi-layer structure. Through the traces and pads of the conductive layers and the through holes of the insulating layers, the electronic units 16 may be electrically connected to each other and/or electrically connected to other external elements through the circuit layer 18.

In FIG. 1, two of the traces 18a1 and one of the traces 18b1 may for example form a conductive line 181, wherein the conductive line 181 may cross the bendable region 32 and electrically connect the first electronic unit 16a to the second electronic unit 16b. One of the traces 18a1, one of the traces 18b1 and one of the pads 18c1 may form another conductive line 182 for electrically connecting the first electronic unit 16a or the second electronic unit 16b to another external element. The conductive line 181 and the conductive line 182 of the circuit layer 18 in FIG. 1 are as an example, and the conductive line 181 and the conductive line 182 of the present disclosure are not limited to the mentioned above and may be formed of different connecting configurations or structures. In some embodiments, the sequence of alternately stacking the conductive layers and the insulating layers, the number of the conductive layers, the number of the insulating layers, the layout of the traces, and/or the positions of the through holes of the insulating layers are not limited herein and may be adjusted according to requirements.

Figure 2:
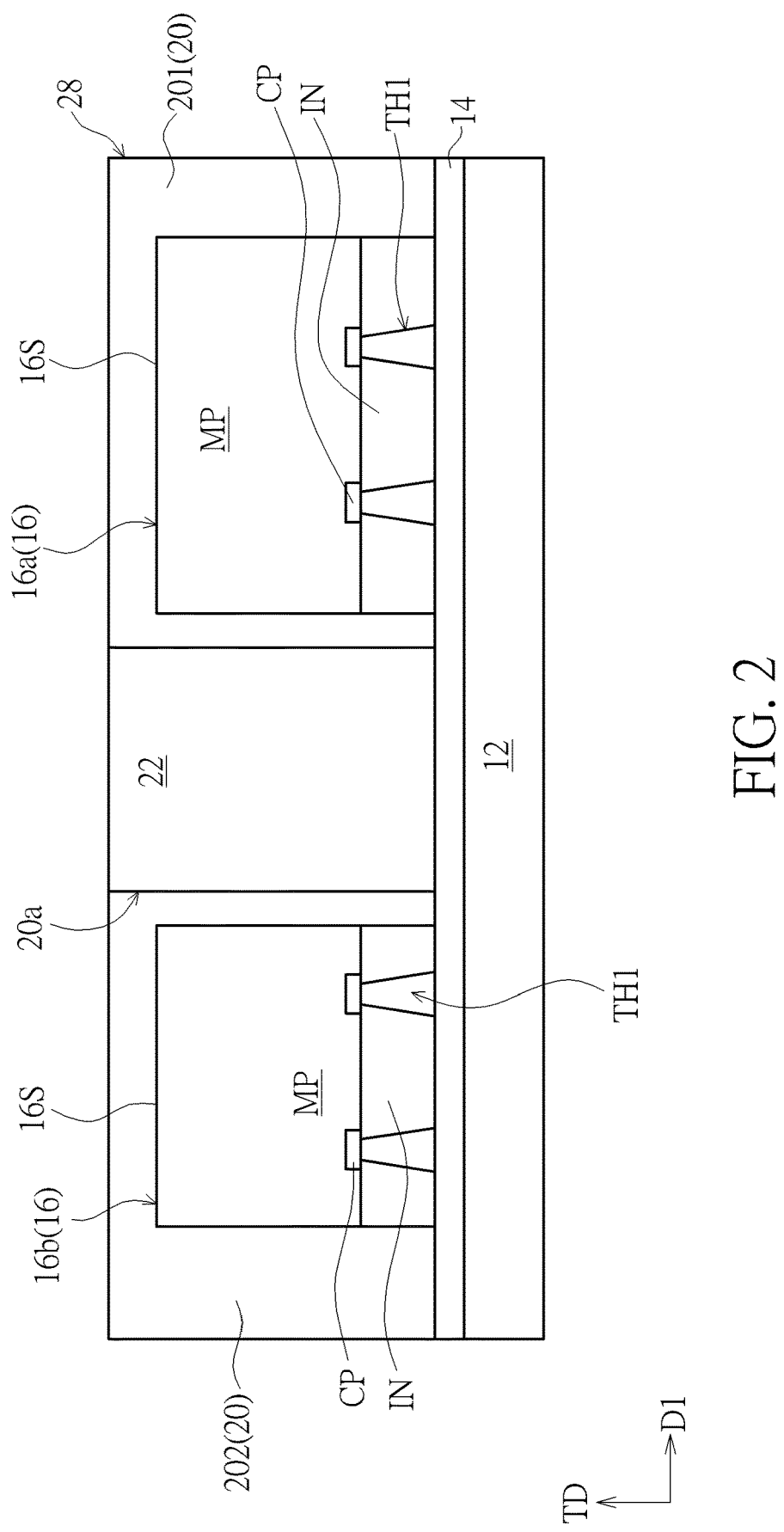
FIG. 2 and FIG. 3 are schematic diagrams illustrating a manufacturing method of the electronic device according to the first embodiment of the present disclosure.
Figure 3:
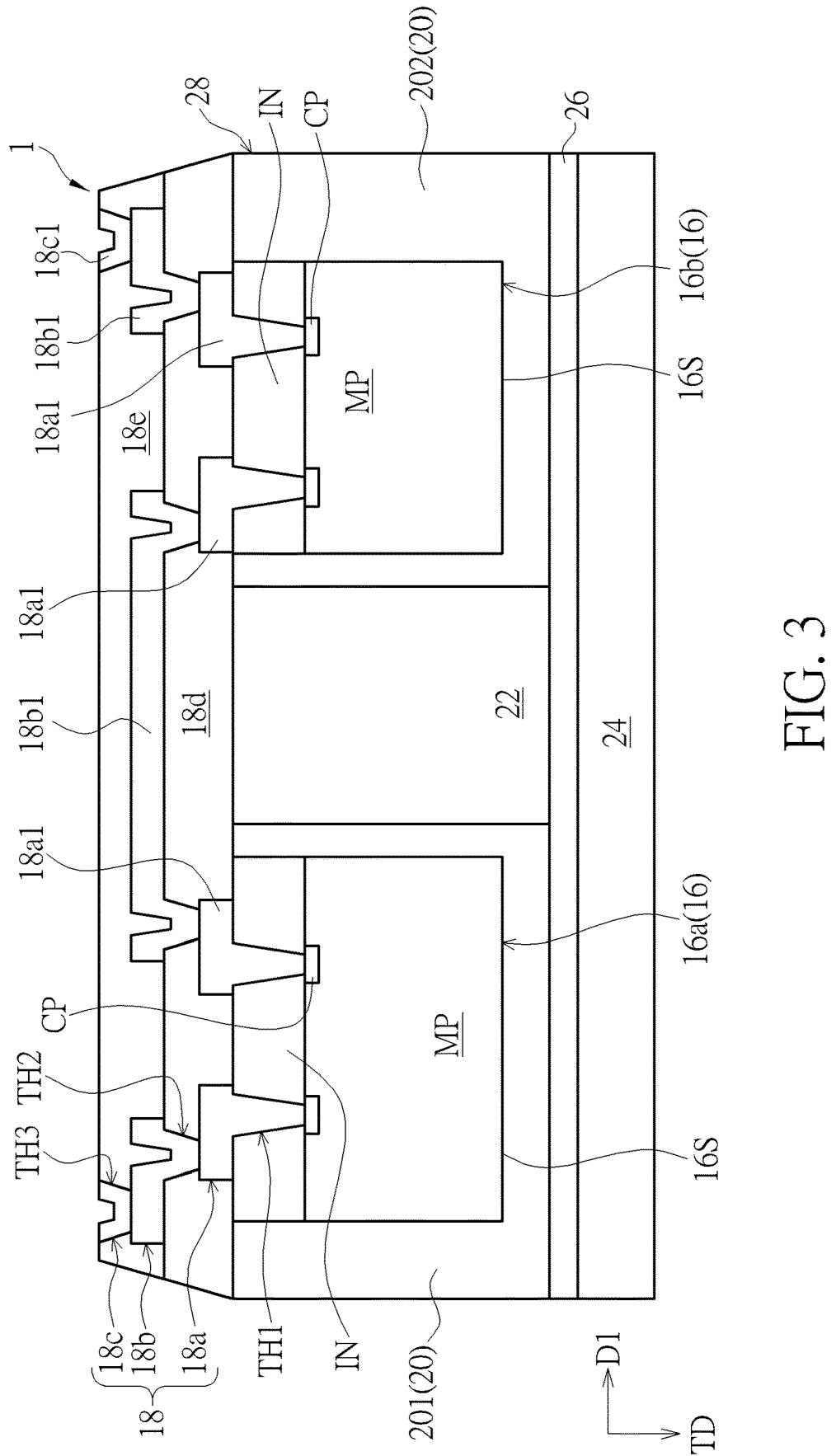

Please refer to FIG. 2 and FIG. 3 together with FIG. 1. FIG. 2 and FIG. 3 are schematic diagrams illustrating a manufacturing method of the electronic device according to the first embodiment of the present disclosure. The manufacturing method of this embodiment takes a chip first method as an example, but not limited thereto. As shown in FIG. 2, a carrier 12 is provided first for carrying the electronic unit 16 and the formed circuit layer 18. The carrier 12 may include, for example, glass, wafer, electronic device, electronic device surrounded by a protection layer, or other carriers suitable for carrying the circuit layers. In some embodiments, the carrier 12 may include a flexible substrate and be disposed on a rigid carrier, in which the flexible substrate may include, for example, PI or polyethylene terephthalate (PET), but not limited thereto. After the carrier 12 is provided, a release layer 14 may be optionally formed on the carrier 12. The release layer 14 may be used to separate the carrier 12 from the formed elements after subsequent steps are completed. The release layer 14 may include, for example, polyethylene (PE) release film, PET release film, oriented polypropylene (OPP) release film, composite release film (i.e., the release layer is formed or composed of two or more materials), etc., but not limited thereto.

As shown in FIG. 2, after the carrier 12 is provided or the release layer 14 is formed, the first electronic unit 16*a* and the second electronic unit 16*b* are disposed on the carrier 12. In this step, the first electronic unit 16*a* and the second electronic unit 16*b* may be disposed in a manner that the pads CP face the carrier 12, that is, disposed in a face-down manner. The sequence of disposing the first electronic unit 16*a* and disposing the second electronic unit 16*b* may be adjusted arbitrarily. Then, the flexible member 22 is formed on the carrier 12. In this embodiment, the flexible member 22 is in a solid state before being formed on the carrier 12, so the flexible member 22 may be formed on the carrier 12 by placing, so that the flexible member 22 may be accurately disposed at a predetermined position, but the present disclosure is not limited thereto. In FIG. 2, the flexible member 22 may be disposed between the first electronic unit 16*a* and the second electronic unit 16*b*, but not limited thereto. In some embodiments, the step of disposing the flexible member 22 may be performed before the step of disposing the first electronic unit 16*a* and the step of disposing the second electronic unit 16*b* or between the step of disposing the first electronic unit 16*a* and the step of disposing the second electronic unit 16*b*.

As shown in FIG. 2, after the first electronic unit 16*a* and the second electronic unit 16*b* are disposed, a protection layer 20 may be formed on the carrier 12, thereby forming a semi-finished structure 28. In this embodiment, the protection layer 20 may be formed after the flexible member 22 is formed. For example, the step of forming the protection layer 20 may include forming a package material on the first electronic unit 16*a*, the second electronic unit 16*b*, the flexible member 22 and the carrier 12 and then performing a thinning process on the package material to remove the package material on the flexible member 22, thereby forming the protection layer 20. The step of forming the package material may include, for example, a molding process or other suitable process. The thinning process may include, for example, a mechanical polishing process, a chemical polishing process, or other suitable processes. In some embodiments, the thinning process may further remove the protection layer 20 on the back surface 16S of the first electronic unit 16*a* and the back surface 16S of the second electronic unit 16*b* to expose the back surface 16S of the first electronic unit 16*a* and the back surface 16S of the second electronic unit 16*b*, but not limited thereto.

It should be noted that the molding process needs to be performed in a high temperature environment, and then, the formed protection layer 20 is cooled to room temperature. In this situation, the protection layer 20 is prone to shrink in volume, so that when there is no flexible member 22 disposed between the first electronic unit 16*a* and the second electronic unit 16*b*, relative positions of the first electronic unit 16*a* and the second electronic unit 16*b* may be easily shifted. In this embodiment, since the flexible member 22 is disposed between the first electronic unit 16*a* and the second electronic unit 16*b*, the shift of the relative positions of the first electronic unit 16*a* and the second electronic unit 16*b* may be reduced, thereby improving process efficiency and product quality.

As shown in FIG. 3, after the protection layer 20 is formed, the semi-finished structure 28 including the first electronic unit 16*a*, the second electronic unit 16*b*, the flexible member 22 and the protection layer 20 may be turned upside down and transferred to another carrier 24 so as to expose the through holes TH1 and the pads CP. In some embodiments, the release layer 26 may be optionally formed on the carrier 24 first, so that the semi-finished structure 28 may be disposed on the release layer 26 to facilitate releasing of the formed electronic device 1 from the carrier 24 after the subsequent steps are completed, but not limited thereto. The carrier 24 and the release layer 26 may respectively be the same as or similar to the carrier 12 and the release layer 14, for example, and will not be repeated redundantly herein.

In some embodiments, the steps of disposing the first electronic unit 16*a* and the second electronic unit 16*b* on the carrier 12 may be performed in a manner that the back surface 16S faces the carrier 12, that is, in a face-up manner. In this case, the insulating layer IN may cover the pads CP and may not have the through holes TH1 exposing the pads CP. After the first electronic unit 16*a*, the second electronic unit 16*b* and the flexible member 22 are disposed, the protection layer 20 may be formed on the carrier 12, and the thinning process may be performed to remove a portion of the protection layer 20 on the first electronic unit 16*a*, the second electronic unit 16*a* and the second electronic unit 16*a*, thereby exposing the insulating layers IN of the first electronic unit 16*a* and the second electronic unit 16*b*. After that, a first patterning process may be performed to form the through holes TH1 in the insulating layers IN, thereby exposing the pads CP. Accordingly, the semi-finished structure 28 may be formed. In this case, the semi-finished structure 28 may be subjected to subsequent steps without the steps of being turned upside down and transferred to the carrier 24. The first patterning process may include, for example, a laser drilling process or other suitable processes.

Next, the circuit layer 18 is formed on the pads CP of the first electronic unit 16*a* and the second electronic unit 16*b*, the protection layer 20 and the flexible member 22, thereby forming the electronic device 1. In FIG. 3, the method of forming the circuit layer 18 may be, for example, sequentially forming the conductive layer 18*a*, the insulating layer 18*d*, the conductive layer 18*b*, the insulating layer 18*e* and the conductive layer 18*c* on the semi-finished structure 28. The manner of forming the conductive layer may include, for example, a photolithography process, an electroplating process or other suitable processes. The manner of forming the insulating layer may include, for example, a deposition process, a photolithography process or other suitable processes.

As shown in FIG. 1, after the formation of the circuit layer 18, the carrier 24 may be optionally removed to separate the electronic device 1 from the carrier 24 and the release layer 26. In some embodiments, before or after removing the carrier 24 and the release layer 26, conductive balls or conductive bumps may be optionally disposed on the pads 18c1 of the circuit layer 18 for electrical connection and bonding with other elements. In some embodiments, when the number of the first electronic unit 16a and the second electronic unit 16b and the structure of the circuit layer 18 in the semi-finished structure 28 may be different from the design of the single electronic device 1, a cutting process may optionally be performed after the circuit layer 18 is formed to form one or more electronic devices 1 separated from each other.

Figure 4:
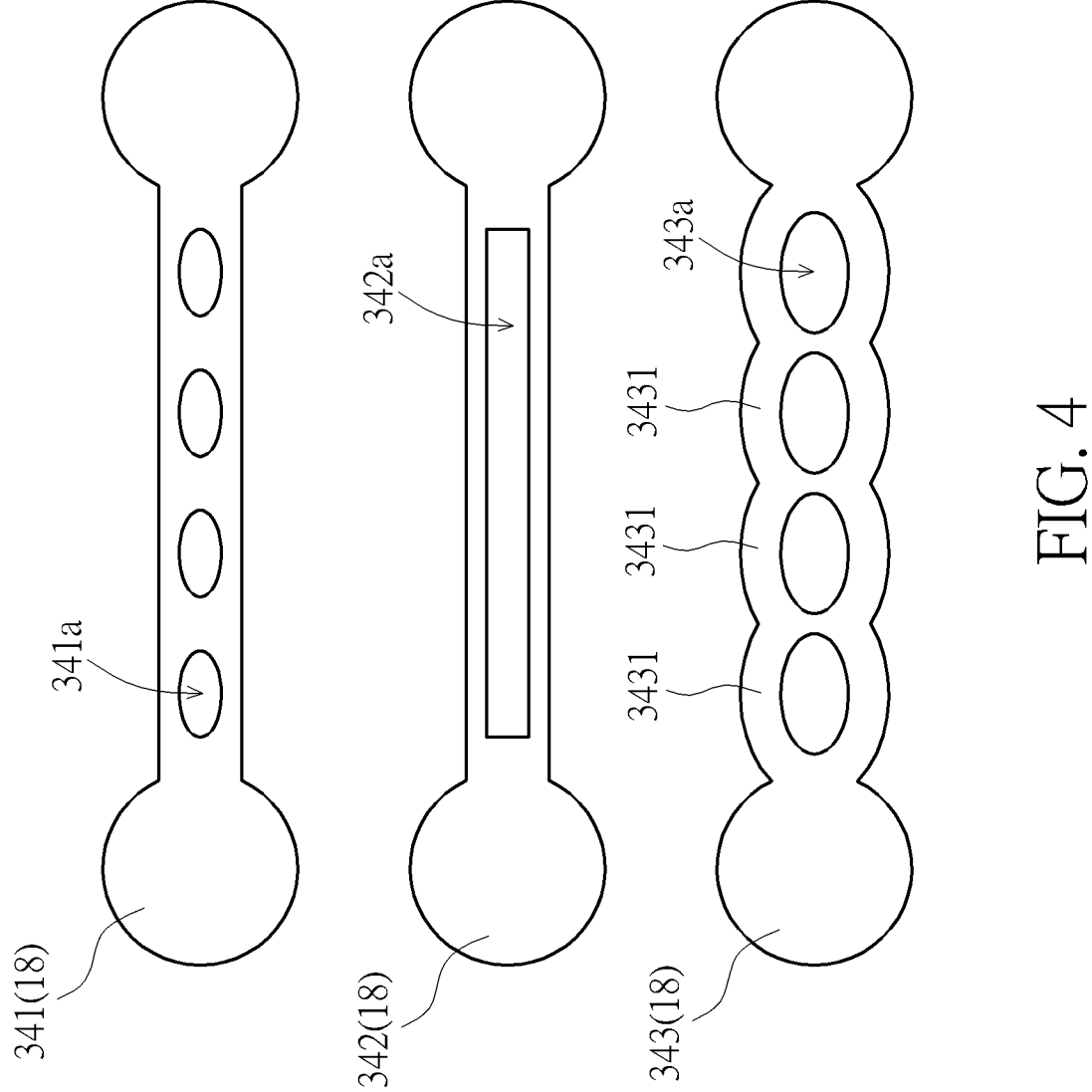
FIG. 4 is a schematic top view illustrating traces according to some embodiments of the present disclosure.

Please refer to FIG. 4, which is a schematic top view illustrating traces according to some embodiments of the present disclosure. As shown in FIG. 4, the circuit layer 18 may include at least one of a trace 341, a trace 342 and a trace 343, and the trace 341, the trace 342 and the trace 343 may have anti-breaking structures, so that possibility of breaking of the trace 341, the trace 342 and the trace 343 may be reduced when the electronic device is bent or flexed. For example, one of the anti-breaking structures may be a hole or other suitable curved structure. The trace 341 may, for example, have a plurality of holes 341a, and a top-view shape of one of the holes 341a viewed from the top-view direction TD may be, for example, an ellipse or other suitable shapes. The trace 342 may, for example, have a hole 342a, and a top view shape of the hole 342a viewed from the top view direction TD may be, for example, a rectangle or other suitable shapes. The trace 343 may, for example, have a plurality of ring structures 3431 connected in series, and each ring structure 3431 may have a hole 343a. The trace 341, the trace 342 and the trace 343 in FIG. 4 may be, for example, mesh structures, and at least one of the trace 341, the trace 342 and the trace 343 may be adapted to any one of traces in the electronic device of any of the embodiments mentioned above or in the following (e.g., the trace 18a1 or the trace 18b1).

Figure 6:
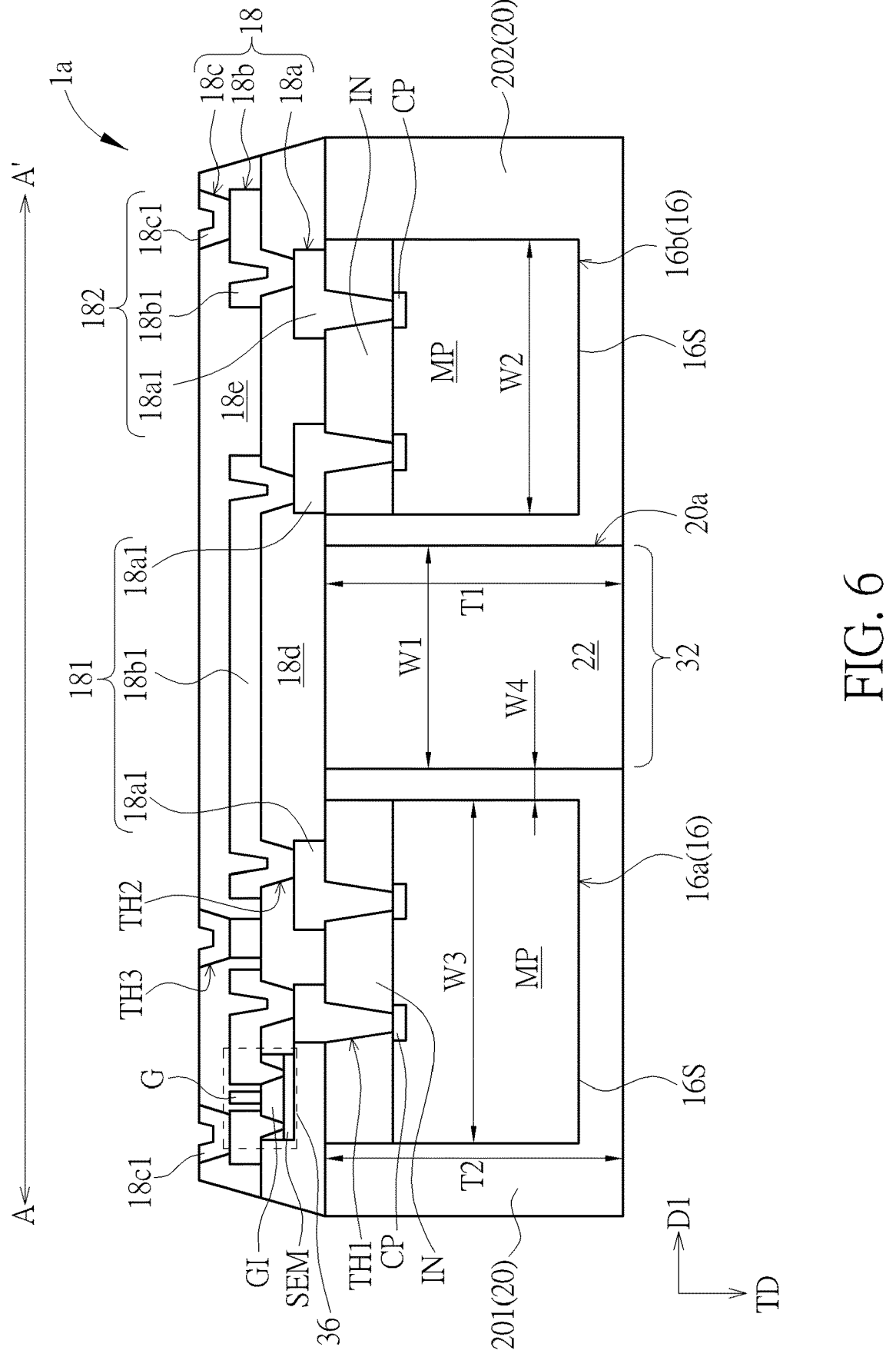
FIG. 6 is a schematic cross-sectional view of FIG. 5 taken along a cross-sectional line A-A'.

Please refer to FIG. 5 and FIG. 6. FIG. 5 is a schematic top view of an electronic device according to some embodiments of the present disclosure, and FIG. 6 is a schematic cross-sectional view of FIG. 5 taken along a cross-sectional line A-A', but not limited thereto. As shown in FIG. 5 and FIG. 6, in the electronic device 1a of some embodiments, the circuit layer 18 may optionally include a transistor 36 electrically connected to at least one of the electronic units 16, such as the first electronic unit 16a and/or the second electronic unit 16b. The transistor 36 may, for example, be electrically connected between the conductive lines 182 or between the conductive lines 181, but not limited thereto. In FIG. 6, the transistor 36 may be, for example, a top-gate type thin film transistor. In some embodiments, the transistor 36 may be, for example, a bottom-gate type thin film transistor, or may be changed to a double-gate transistor or other suitable transistors according to requirements.

The step of forming the transistor 36 may be integrated with the step of forming the conductive layers and the insulating layers. For example, at least a portion of the electrodes of the transistor 36 may be formed of one of the conductive layers in the circuit layer 18, or the step of forming the transistor 36 may be formed before or after the steps of forming the conductive layers and the insulating layers or between any two of the steps of forming the conductive layers and the insulating layers. The transistor 36 shown in FIG. 6 is as an example, but the present disclosure is not limited thereto. In FIG. 6, a top-gate thin film transistor is taken as an example, and the transistor 36 may include, for example, a semiconductor layer SEM, a gate insulating layer GI and a gate G, wherein the semiconductor layer SEM may include a channel region, a drain (source) region and a source (drain) region (not shown), the channel region is disposed between the drain (source) region and the source (drain) region, and the gate insulating layer GI is disposed between the channel region and the gate G. The gate G of the transistor 36 may be formed of the conductive layer 18b, but not limited thereto. In some embodiments, the gate G may be formed of other conductive layers different from the conductive layers shown in FIG. 1. Alternatively, the gate G may include a conductive material different from that of the conductive layers (e.g., the conductive layer 18a, the conductive layer 18b, or the conductive layer 18c) including the traces or the pads. The gate G may for example include aluminum, molybdenum, or other suitable materials. The semiconductor layer SEM and the gate insulating layer GI may, for example, be sequentially disposed in the groove of one of the insulating layers (e.g., the insulating layer 18d), and the conductive layer 18b used for forming the gate G may be disposed on the gate insulating layer GI. The semiconductor layer SEM may include, for example, amorphous silicon, low-temperature polysilicon (LTPS), metal-oxide semiconductor, low temperature polycrystalline oxide (LTPO, such as a combination of low temperature polysilicon and oxide semiconductor), or other suitable semiconductor materials. Two of the traces formed of the same or different conductive layers may be electrically connected to the drain (source) region and the source (drain) region through the through holes in the gate insulating layer GI, but not limited thereto. The structure of the transistor 36 of the present disclosure is not limited to that shown in FIG. 6 and may be adjusted according to requirements. In some embodiments, the circuit layer 18 may include a plurality of transistors 36, and in this case, at least two of the transistors 36 may be of the same or different type.

It should be noted that since there is the transistor 36 disposed in the circuit layer 18, a portion of elements, such as protection elements or switching elements, in the electronic units 16 may be replaced by the transistor 36, so that the electronic units 16 may have more space to accommodate more circuits, thereby improving computing ability or number of functions of the electronic units 16. Moreover, since the circuit layer 18 is directly electrically connected to the electronic units 16, the signal path between the transistor 36 and the electronic units 16 is not long, so that the function of the transistor 36 may be maintained. In some embodiments, active elements and/or passive elements may also be disposed in the circuit layer 18. For example, the circuit layer 18 may have a function of amplifying the signal. The circuit layer 18 may include, for example, an inductor, a resistor, a diode, a capacitor, an electrostatic discharge (ESD) function, a multiplexing (MUX) or demultiplexing (DEMUX) function, or other suitable elements.

The electronic device and the manufacturing method thereof are not limited to the above-mentioned embodiments, and may have different embodiments. In order to simplify the description, the different embodiments below will use the same reference numerals as the first embodiment to denote the same elements. In order to clearly illustrate the different embodiments, the following description will focus on the differences between the different embodiments, and the repeated parts will not be detailed again.

Figure 7:
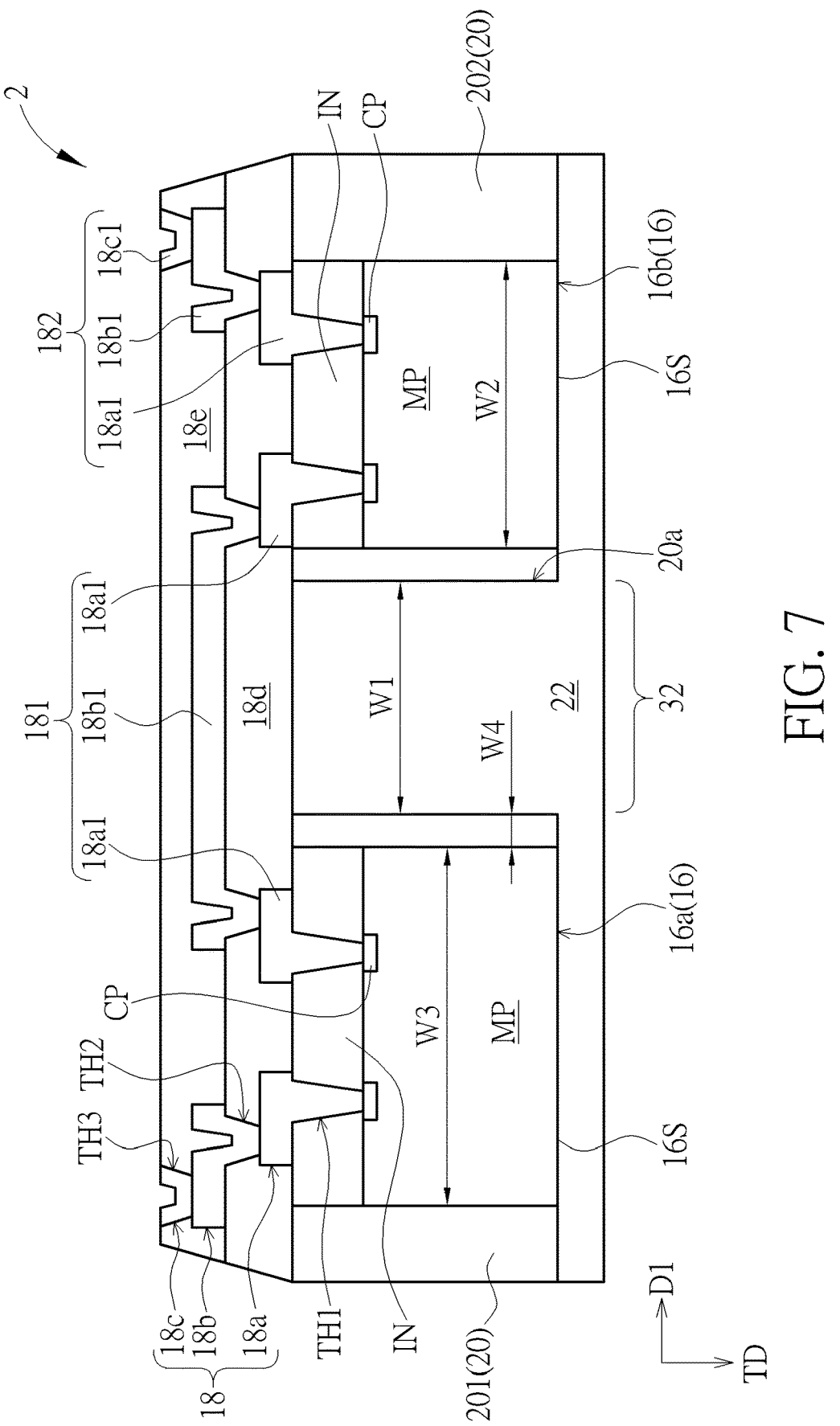
FIG. 7 is a schematic cross-sectional view of an electronic device according to the second embodiment of the present disclosure.

Please refer to FIG. 7, which is a schematic cross-sectional view of an electronic device according to the second embodiment of the present disclosure. As shown in FIG. 7, the electronic device 2 of this embodiment differs from the electronic device 1 shown in FIG. 1 in that the flexible member 22 of this embodiment may be disposed on the back surface 16S of the first electronic unit 16*a* and/or the back surface 16S of the second electronic unit 16*b*. For example, when viewed along the top view direction TD of the electronic device 2, the flexible member 22 may overlap the first electronic unit 16*a* and/or the second electronic unit 16*b*. In this embodiment, the protection layer 20 on the back surface 16S of the first electronic unit 16*a* and the back surface 16S of the second electronic unit 16*b* may be removed, so that the flexible member 22 may be in direct contact with the first electronic unit 16*a* and the second electronic unit 16*b*, but not limited thereto. In some embodiments, in a cross-sectional direction (e.g., the direction D1) and/or the top view direction TD, the protection layer 20 may be disposed between the first electronic unit 16*a* and the flexible member 22, and/or the protection layer 20 may be disposed between the second electronic unit 16*b* and the flexible member 22. In some embodiments, when the thermal conductivity of the protection layer 20 may be less than the thermal conductivity of the flexible member 22, the flexible member 22 may facilitate dissipating heat from the first electronic unit 16*a* and the second electronic unit 16*b*, but not limited thereto. In some embodiments, the flexible member 22 may further include thermally conductive particles to improve heat dissipation, but not limited thereto.

In some embodiments, when the flexible member 22 is disposed on the back surface 16S of the first electronic unit 16*a* and the back surface 16S of the second electronic unit 16*b*, a portion of the protection layer 20 may be located between the back surface 16S of the first electronic unit 16*a* and the flexible member 22 and between the back surface 16S of the second electronic unit 16*b* and the flexible member 22, that is, the protection layer 20 on the back surface 16S of the first electronic unit 16*a* and the back surface 16S of the second electronic unit 16*b* may not be removed. Other elements of the electronic device 2 shown in FIG. 7 may refer to the mentioned above and will not detailed again. In some embodiments, the electronic device 2 shown in FIG. 7 may use the traces of FIG. 4 and/or the transistor of FIG. 6.

Figure 8:
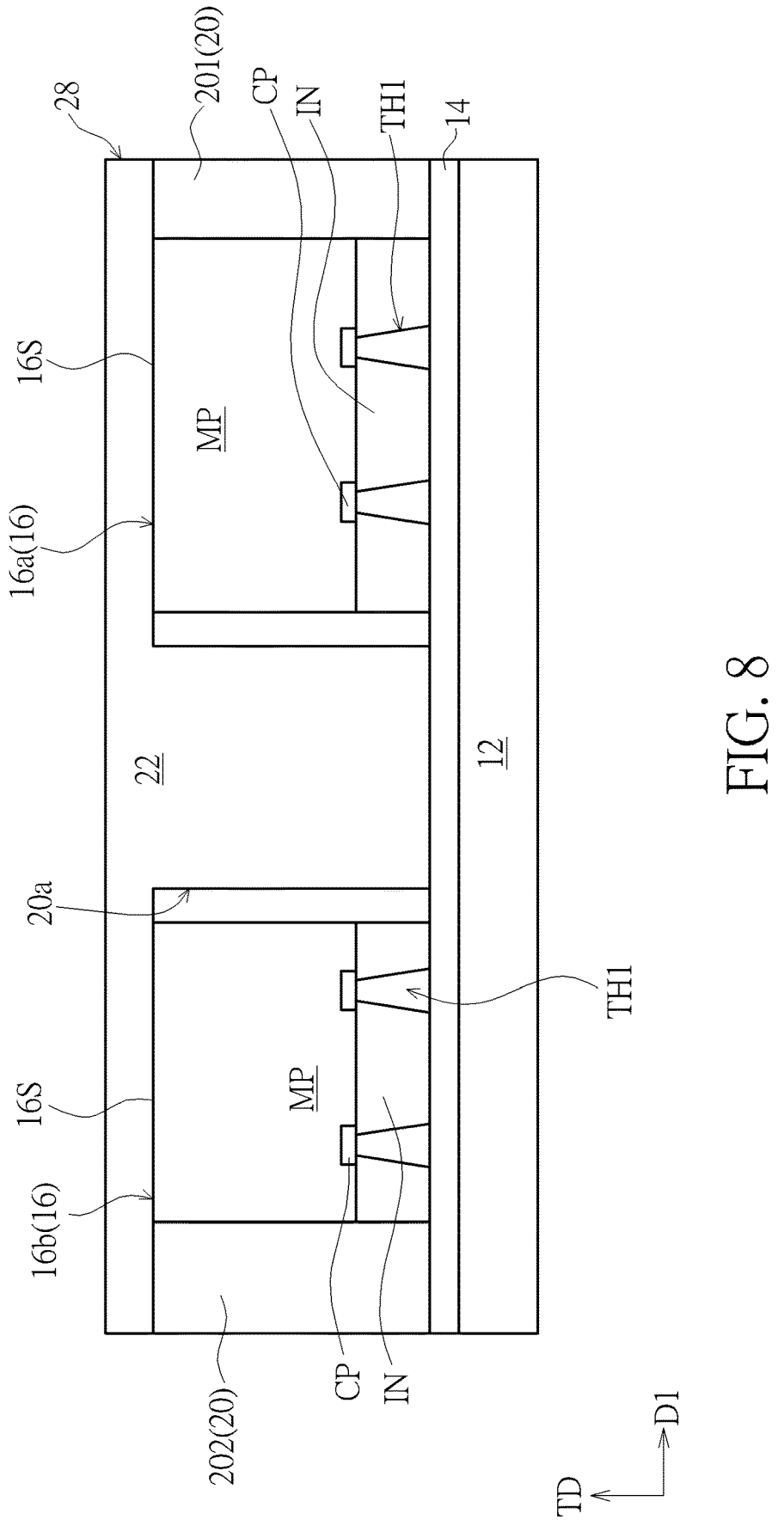
FIG. 8 and FIG. 9 are schematic diagrams illustrating a manufacturing method of the electronic device according to the second embodiment of the present disclosure.
Figure 9:
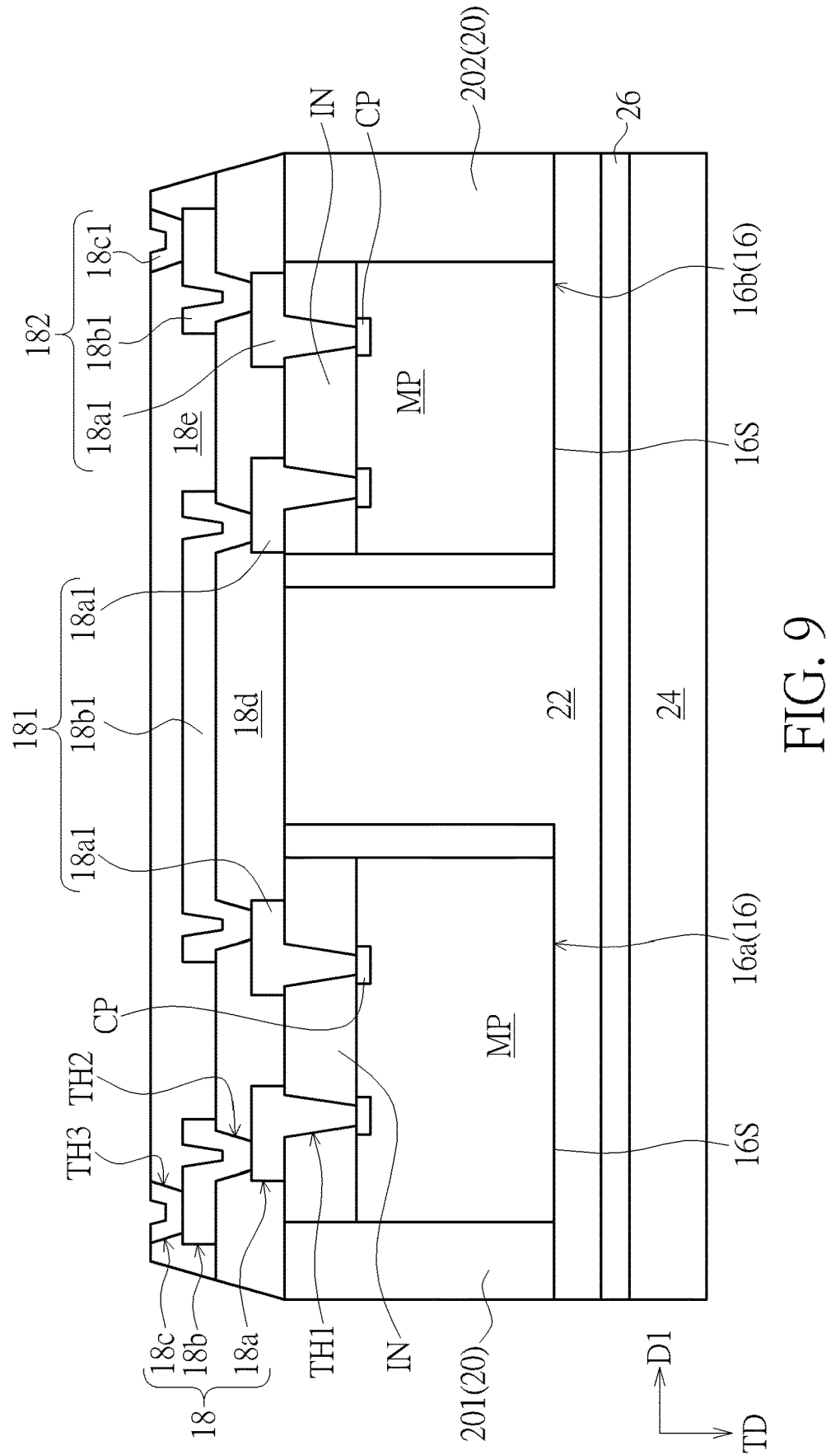

Please refer to FIG. 8 and FIG. 9 as well as FIG. 7. FIG. 8 and FIG. 9 are schematic diagrams illustrating a manufacturing method of the electronic device according to the second embodiment of the present disclosure. As shown in FIG. 8, the manufacturing method of this embodiment differs from the manufacturing method shown in FIG. 1 to FIG. 3 in that the flexible member 22 of this embodiment is formed after the protection layer 20 is formed. In this embodiment, the pads CP of the first electronic unit 16*a* and the second electronic unit 16*b* may face the carrier 12. Specifically, after the first electronic unit 16*a* and the second electronic unit 16*b* are disposed, the protection layer 20 having the opening 20*a* may be formed first. Next, the flexible member 22 is formed in the opening 20*a* and on the carrier 12. In this embodiment, the method for forming the protection layer 20 may, for example, include forming the package material on the first electronic unit 16*a* and the second electronic unit 16*b* first, and then performing a second patterning process to form the opening 20*a* in the package material, thereby forming the protection layer 20. The second patterning process may include, for example, a photolithography process and an etching process or other suitable processes.

It is noted that, the flexible member 22 may be, for example, in a liquid state before being formed, so that the flexible member 22 may fill up the opening 20*a* when the flexible member 22 is disposed on the protection layer 20. Then, the flexible member 22 in the liquid state may be cured through a curing process to form the flexible member 22. The curing process may, for example, include heat curing or other suitable manners.

As shown in FIG. 9, after the protection layer 20 and the flexible member 22 are formed, the semi-finished structure 28 including the first electronic unit 16*a*, the second electronic unit 16*b*, the flexible member 22 and the protection layer 20 may be turned upside down and transferred to another carrier 24 (or the release layer 26) to expose pads CP.

In some embodiments, the steps of disposing the first electronic unit 16*a* and the second electronic unit 16*b* on the carrier 12 shown in FIG. 8 and FIG. 9 may be disposed in a face-up manner. In this case, before the protection layer 20 is formed, the insulating layers IN may cover the pads CP, and after the protection layer 20 is formed, the insulating layers IN of the first electronic unit 16*a* and the second electronic unit 16*b* are exposed. After that, a first patterning process is performed to form the through holes TH1 in the insulating layers IN, thereby exposing the pads CP. In such situation, the semi-finished structure 28 may be subjected to subsequent steps without performing the steps of turning the semi-finished structure 28 upside down and transferring the semi-finished structure 28 to the carrier 24.

As shown in FIG. 9, after the pads CP are exposed, the circuit layer 18 may be formed on the pads CP of the first electronic unit 16*a* and the second electronic unit 16*b*, the protection layer 20 and the flexible member 22, thereby forming the electronic device 2. The steps of turning and transferring the semi-finished structure 28 and the step of forming the circuit layer 18 in this embodiment may refer to the above-mentioned embodiments and will not be repeated herein.

As shown in FIG. 7, after the circuit layer 18 is formed, the carrier 24 and the release layer 26 may be removed. The method of removing the carrier 24 and the release layer 26 may refer to the above-mentioned embodiments and will not be described again. In some embodiments, after the circuit layer 18 is formed, a cutting process may optionally be performed to form one or more electronic devices 2 separated from each other. Other steps in the manufacturing method of the electronic device 2 shown in FIG. 7 to FIG. 9 may refer the mentioned above and will not be detailed again.

Figure 10:
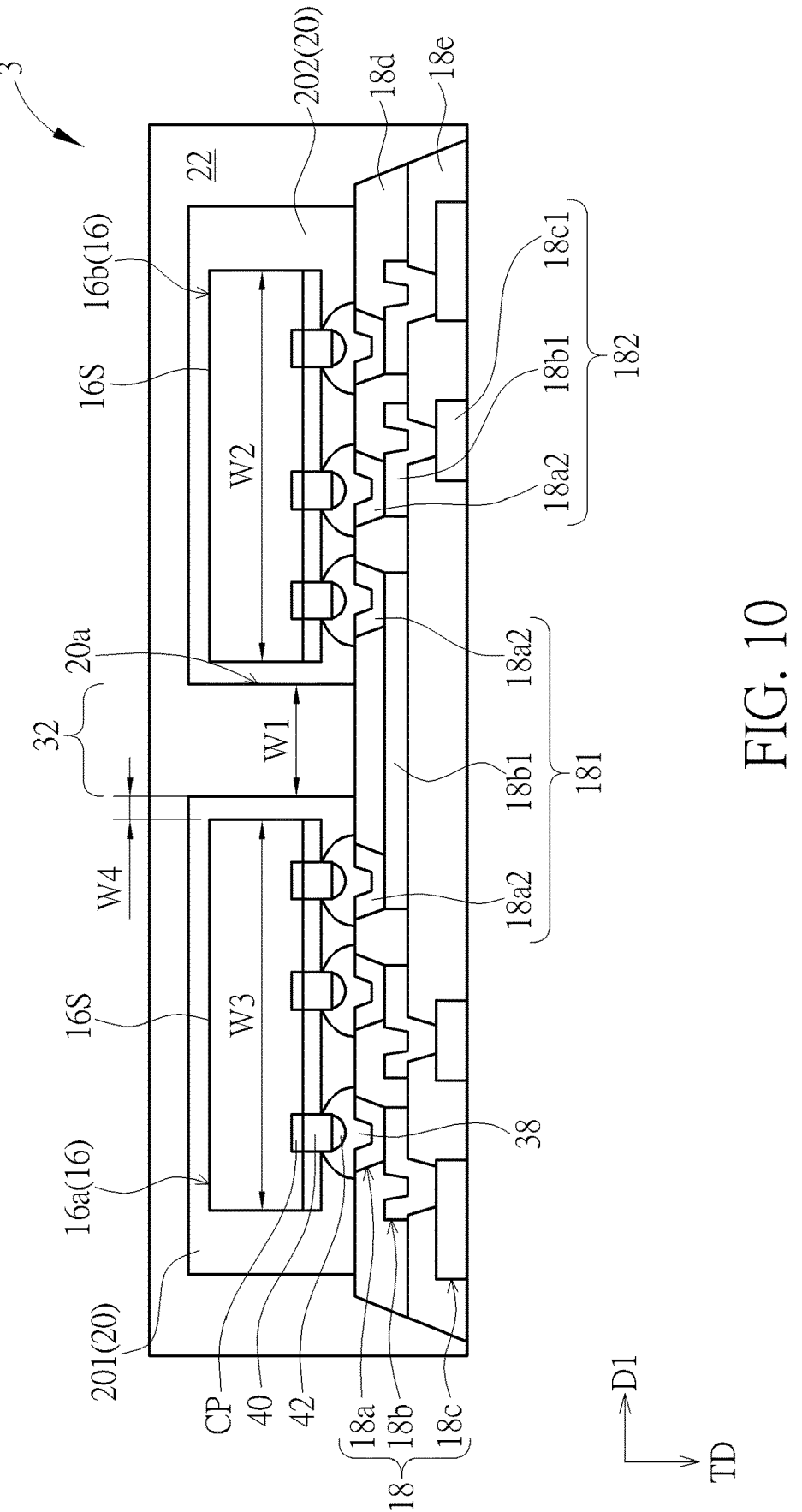
FIG. 10 is a schematic cross-sectional view of an electronic device according to a third embodiment of the present disclosure.

Please refer to FIG. 10, which is a schematic cross-sectional view of an electronic device according to a third embodiment of the present disclosure. As shown in FIG. 10, the electronic device 3 of this embodiment differs from the electronic device 1 shown in FIG. 1 in that the flexible member 22 of this embodiment may surround the protection layer 20. In this embodiment, the flexible member 22 may be further disposed on the back surface 16S of the first electronic unit 16*a* and/or the back surface 16S of the second electronic unit 16*b*, so that the flexible member 22 may cover at least a portion of the protection layer 20, but not limited thereto. In addition, the flexible member 22 may optionally further extend onto the sidewalls of the circuit layer 18, but not limited thereto. In some embodiments, in the cross-sectional direction (e.g., the direction D1) and/or the top view direction TD of the electronic device 3, the protection layer 20 may be disposed between the first electronic unit 16*a* and the flexible member 22, and/or the protection layer 20 may be disposed between the second electronic unit 16*b* and the flexible member 22.

In the electronic device 3 of FIG. 10, conductive balls 38 may be provided on an uppermost conductive layer (e.g., the conductive layer 18*a*) of the circuit layer 18, and the first electronic unit 16*a* and the second electronic unit 16*b* may further include conductive pillars 40 and the solder caps 42, so that the first electronic unit 16*a* and the second electronic unit 16*b* may be bonded to and electrically connected to the circuit layer 18 through the conductive pillars 40, the solder caps 42 and the conductive balls 38. The conductive balls 38 may include, for example, solder balls or other suitable materials. The conductive pillars 40 may include, for example, copper or other suitable materials. The solder caps 42 may include, for example, tin or other suitable materials. Other elements of the electronic device 3 shown in FIG. 10 may refer to the mentioned above and will not be detailed again.

Figure 11:
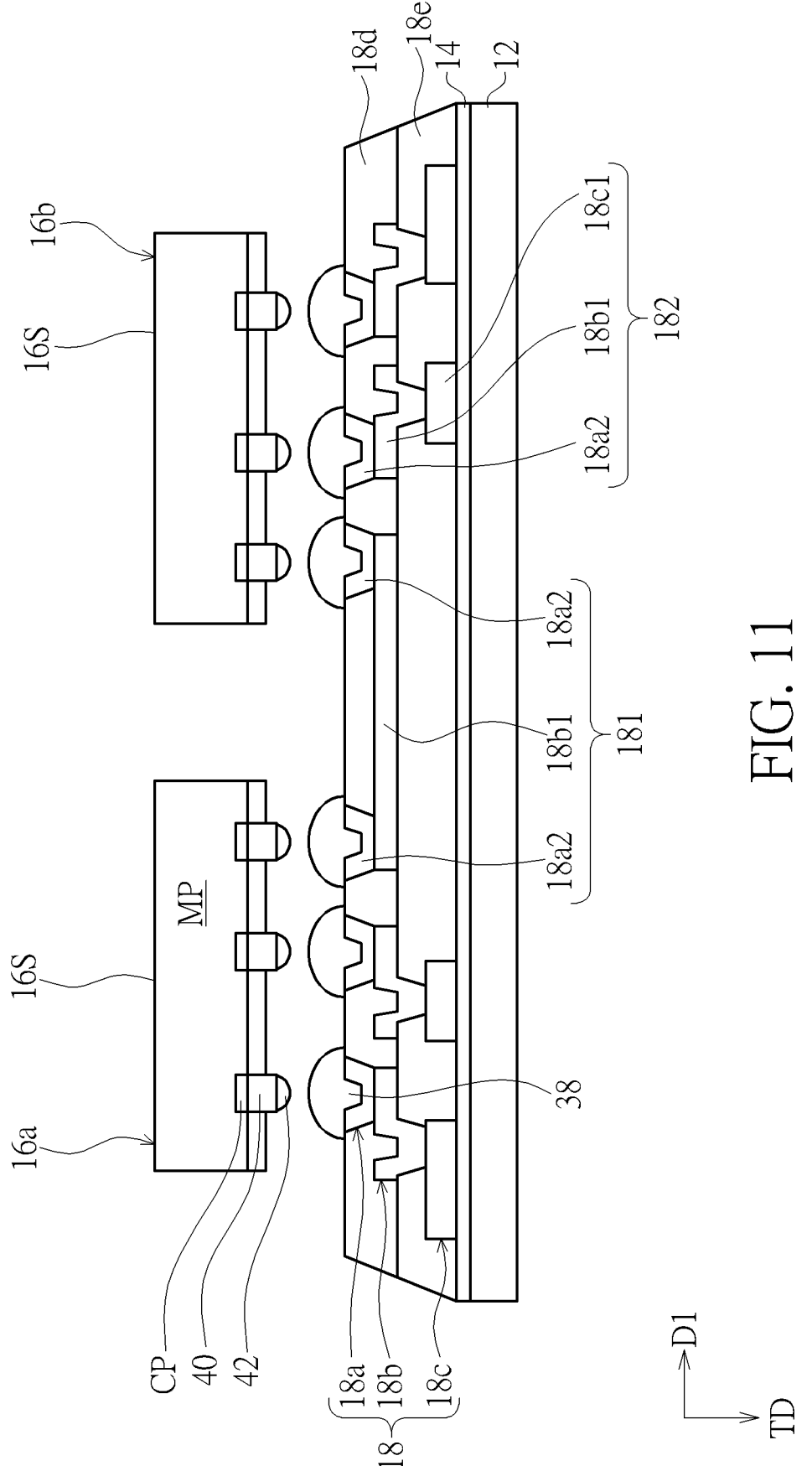
FIG. 11 to FIG. 13 are schematic diagrams illustrating a manufacturing method of the electronic device according to the third embodiment of the present disclosure.
Figure 12:
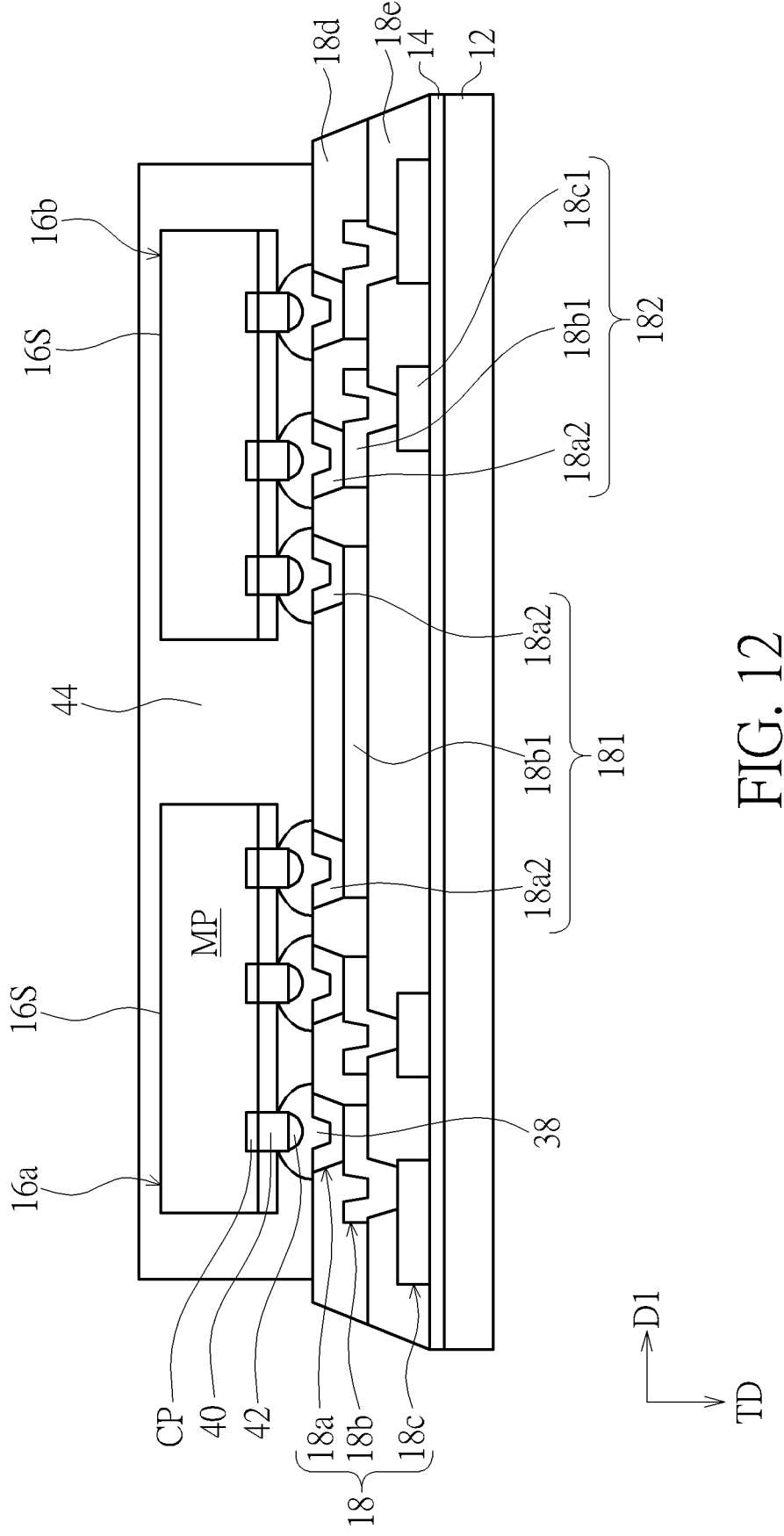
Figure 13:
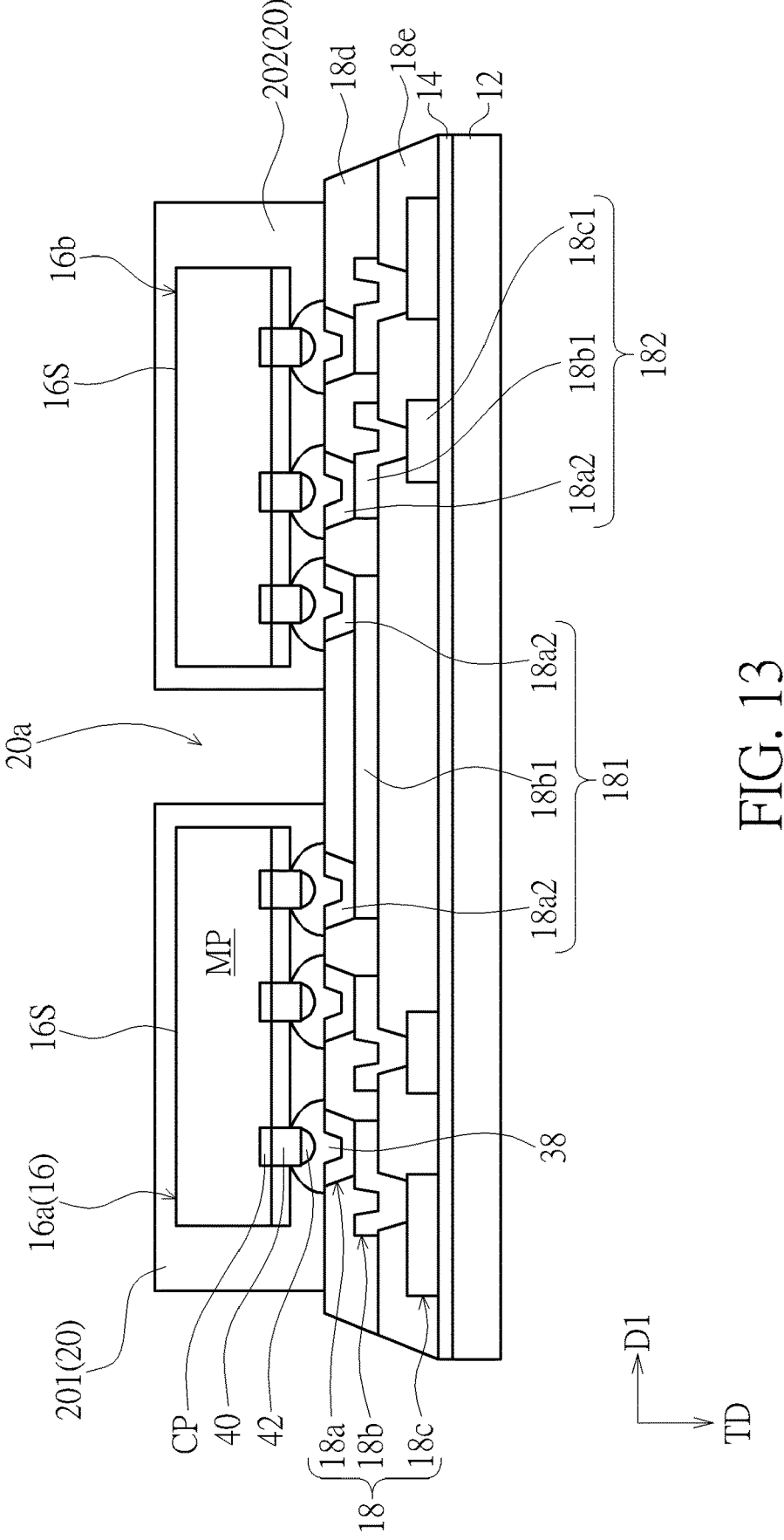

Please refer to FIG. 11 to FIG. 13 together with FIG. 10. FIG. 11 to FIG. 13 are schematic diagrams illustrating a manufacturing method of the electronic device according to the third embodiment of the present disclosure. As shown in FIG. 11, the manufacturing method of this embodiment differs from the manufacturing method shown in FIG. 1 to FIG. 3 in that the circuit layer 18 of this embodiment is formed on the carrier 12 before disposing the first electronic unit 16*a* and the second electronic unit 16*b*. In other words, the manufacturing method of this embodiment may use a RDL first method. Specifically, after the carrier 12 and the release layer 14 are provided, the circuit layer 18 may be formed on the carrier 12. In the embodiment of FIG. 11, the conductive layer 18*c*, the insulating layer 18*e*, the conductive layer 18*b*, the insulating layer 18*d* and the conductive layer 18*a* may be formed in sequence, wherein the conductive layer 18*b* is disposed in the through holes of the insulating layer 18*e*, and the conductive layer 18*a* is disposed in the through holes of the insulating layer 18*d* and includes the pad 18*a*2, but not limited thereto. Then, the conductive balls 38 are disposed on the pads 18*a*2 of the uppermost conductive layer (e.g., the conductive layer 18*a*) of the circuit layer 18. In addition, the conductive pillars 40 and solder caps 42 may be optionally and sequentially formed on the pads CP of the first electronic unit 16*a* and the second electronic unit 16*b* to facilitate bonding with the conductive balls 38. The method of forming the circuit layer 18 is not limited to that shown in FIG. 11 and may be adjusted according to the requirements.

As shown in FIG. 12, subsequently, the first electronic unit 16*a* and the second electronic unit 16*a* may be disposed on and bonded to the circuit layer 18 in a flip-chip bonding manner, that is, in a manner of the pads CP of the first electronic unit 16*a* and the second electronic unit 16*b* facing the circuit layer 18. The first electronic unit 16*a* and the second electronic unit 16*b* may be bonded and electrically connected to the circuit layer 18 for example through the solder caps 42 and the conductive balls 38. After bonding the first electronic unit 16*a* and the second electronic unit 16*b* to the circuit layer 18, a package material 44 may be formed on the circuit layer 18, the first electronic unit 16*a* and the second electronic unit 16*b*. The method of forming the package material 44 may include, for example, a molding process or other suitable process.

As shown in FIG. 13, the second patterning process is performed to form the opening 20*a* in the package material 44, thereby forming the protection layer 20 on the circuit layer 18, the first electronic unit 16*a* and the second electronic unit 16*b*, wherein the opening 20*a* may expose the circuit layer 18.

As shown in FIG. 10, after the protection layer 20 is formed, the flexible member 22 may be formed on the circuit layer 18 and the protection layer 20, so that the electronic device 3 of this embodiment may be formed. In the embodiment of FIG. 10, the flexible member 22 may seal the protection layer 20 on the circuit layer 18, but not limited thereto. The method of forming the flexible member 22 may refer to the method of forming the flexible member 22 shown in FIG. 8 and will not be detailed herein. In some embodiments, after the flexible member 22 is formed, the carrier 24 and the release layer 26 may be removed. The method of removing the carrier 24 and the release layer 26 may refer to the above-mentioned embodiments and will not be repeated herein. In some embodiments, after the flexible member 22 is formed, a cutting process may optionally be performed to form one or more electronic devices 3 separated from each other. In some embodiments, other steps of the manufacturing method of the electronic device 3 shown in FIG. 10 to FIG. 13 may refer to the mentioned above and will not be detailed again.

In some embodiments, the method of forming the flexible member 22 may also refer to the method of FIG. 2 and may include disposing the solid flexible member 22 on the circuit layer 18 after the circuit layer 18 is formed. In such case, the step of disposing the flexible member 22 may be performed before or after the steps of disposing the first electronic unit 16*a* and the second electronic unit 16*b*, or between the step of disposing the first electronic unit 16*a* and the step of disposing the second electronic unit 16*b*.

Figure 14:
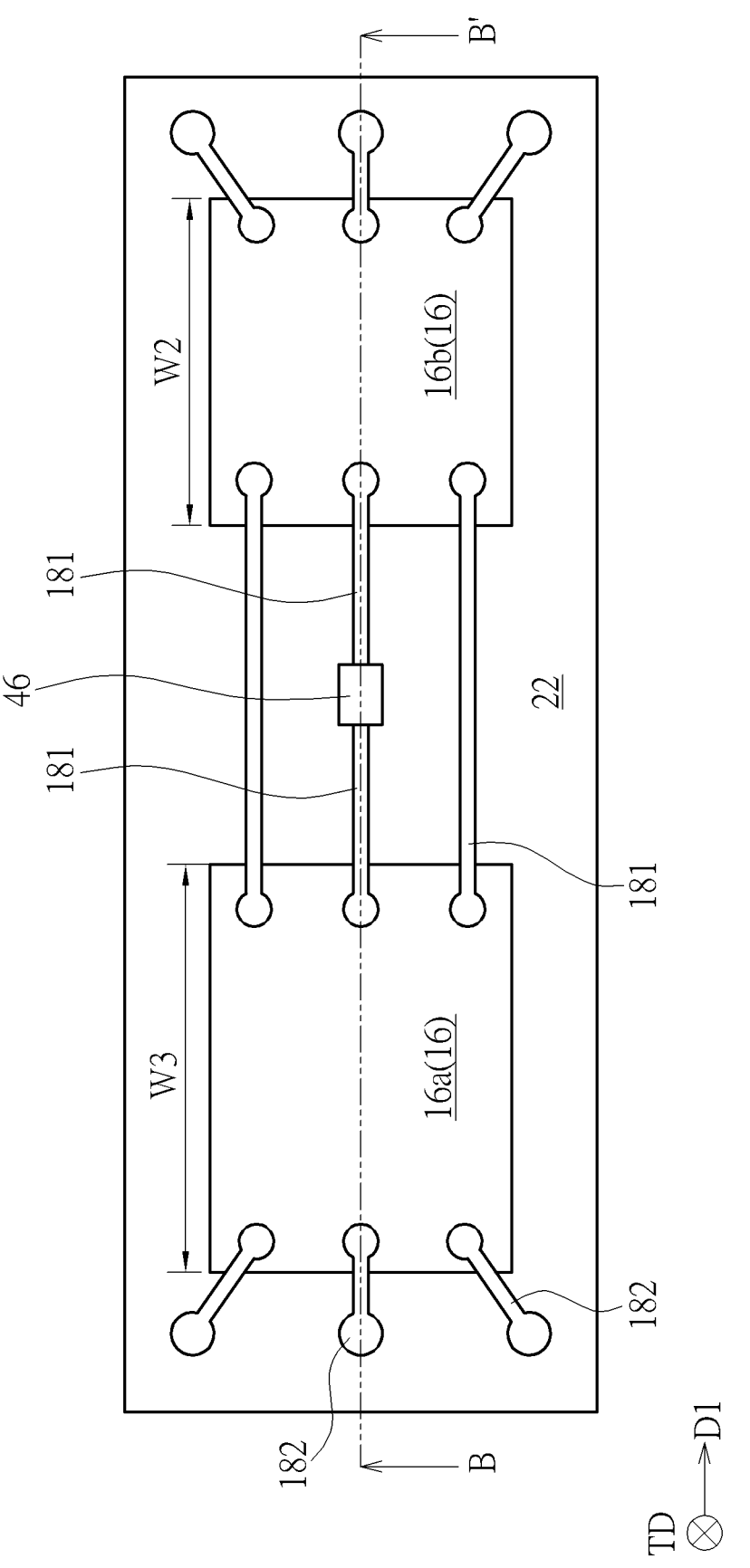
FIG. 14 is a schematic top view of an electronic device according to a fourth embodiment of the present disclosure.
Figure 15:
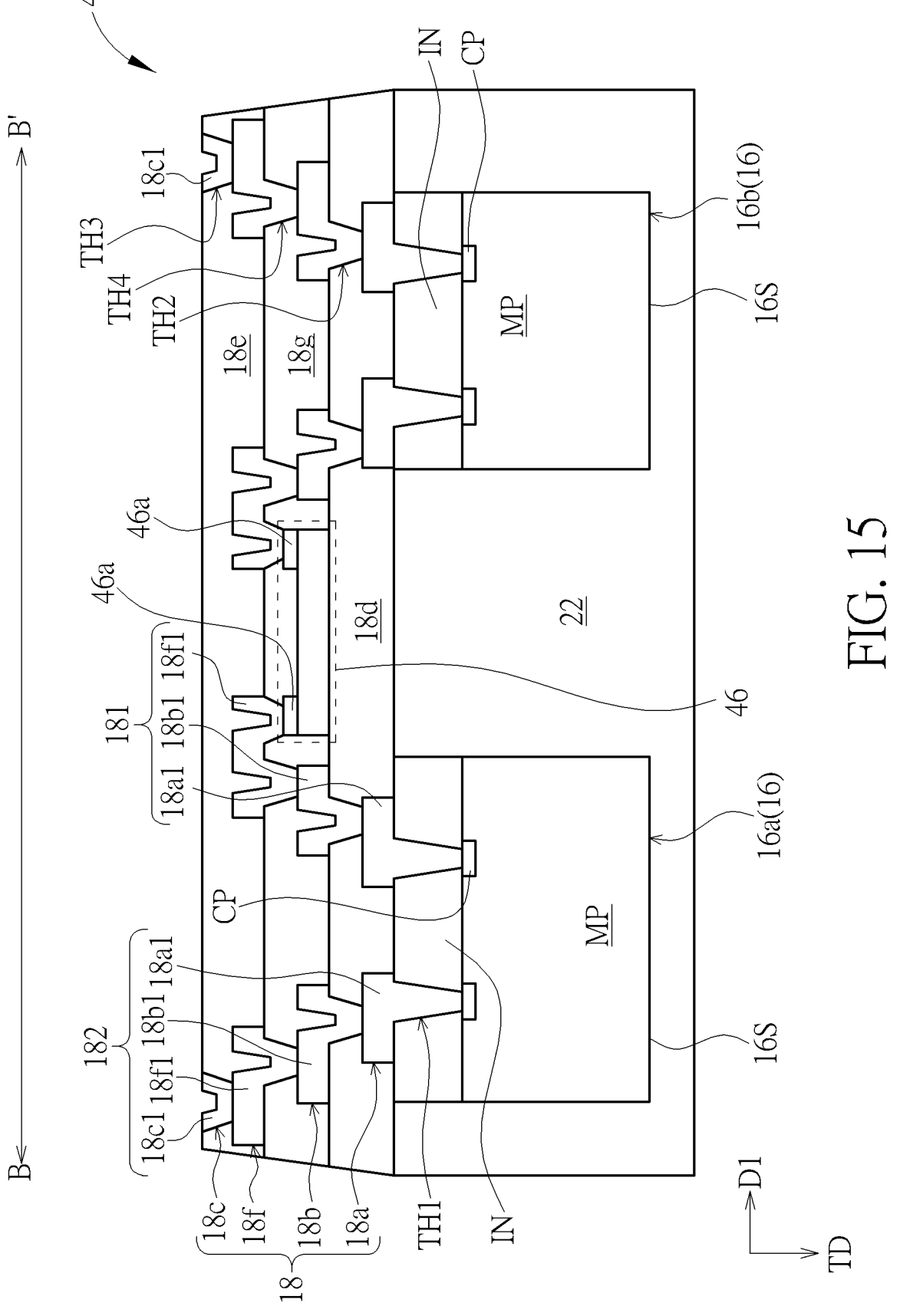
FIG. 15 is a schematic cross-sectional view of FIG. 14 taken along a cross-sectional line B-B'.

Please refer to FIG. 14 and FIG. 15. FIG. 14 is a schematic top view of an electronic device according to a fourth embodiment of the present disclosure, and FIG. 15 is a schematic cross-sectional view of FIG. 14 taken along a cross-sectional line B-B', but not limited thereto. As shown in FIG. 14 and FIG. 15, the electronic device 4 of this embodiment differs from the above-mentioned embodiments in that the electronic device 4 of this embodiment does not include the protection layer, and the flexible member 22 may at least surround the electronic units 16 and used to protect the electronic units 16. In this embodiment, a surface of the flexible member 22 facing the circuit layer 18 may directly contact the circuit layer 18 (e.g., directly contact a surface of the insulating layer 18*d* of the circuit layer 18 facing the flexible member 22). In some embodiments, the flexible member 22 may further directly contact a sidewall of the first electronic unit 16*a* and a sidewall of the second electronic unit 16*b*. In some embodiments, the flexible member 22 may be disposed on a surface of the first electronic unit 16*a* opposite to the circuit layer 18 and a surface of the second electronic unit 16*b* opposite to the circuit layer 18. The flexibility of the electronic device 4 may be improved by using the flexible member 22 as a film for encapsulating the first electronic unit 16*a* and the second electronic unit 16*b*. The electronic units 16 of this embodiment may be the same as or similar to the above-mentioned embodiments and will not be detailed again.

As shown in FIG. 15, the circuit layer 18 may include a plurality of conductive lines 181 and a plurality of conductive lines 182, wherein the conductive lines 181 may be electrically connected between the first electronic unit 16*a* and the second electronic unit 16*b*, and the conductive lines 182 may include pads 18*c*1 used to electrically connect the first electronic unit 16*a* and/or the second electronic unit 16*b* to external element. As compared with the above-mentioned embodiments, in the embodiment of FIG. 15, the circuit layer 18 may further include a conductive layer 18*f* and an insulating layer 18*g*, wherein the insulating layer 18*g* may be disposed between the insulating layer 18*d* and the insulating layer 18*e* and include a plurality of through holes TH4, the conductive layer 18*f* may be disposed between the insulating layer 18*g* and the insulating layer 18*e* and include a plurality of traces 18*f*1, and the traces 18*f*1 may extend into the corresponding through holes TH4 and may be used as a portion of the conductive line 181 or the conductive line 182, but the present disclosure is not limited thereto. The method for forming the electronic device 4 in this embodiment may refer to the mentioned above and will not be described again.

As shown in FIG. 15, in some embodiments, the electronic device 4 may further include at least one functional element 46 disposed in the circuit layer 18 and electrically connected to at least one of the first electronic unit 16*a* and the second electronic unit 16*b*. The functional element 46 may be electrically connected to the first electronic unit 16*a* and/or the second electronic unit 16*b*, for example, through the conductive lines 181. In some embodiments, the functional element 46 may be electrically connected between the first electronic unit 16*a* and the second electronic unit 16*b*. In some embodiments, the functional element 46 may, for example, have at least a portion that is not surrounded by the circuit layer 18 or is disposed on a surface of the circuit layer 18 opposite to the electronic units 16, but not limited thereto.

The functional element 46 may be, for example, an integrated passive device (IPD). The functional element 46 may for example include a capacitor, an inductor, a sensor, a diode, or other suitable passive elements. The sensor may be, for example, optical sensor, thermal sensor, or other suitable sensors. The diode may be, for example, as mentioned above and will not be repeated herein. For example, at least a portion of functional element 46 may be formed by using the process for forming the circuit layer 18. For example, when the functional element 46 includes an element having pins 46*a*, the pins 46*a* may be formed of one of the conductive layers of the circuit layer 18 (e.g., the conductive layer 18*b* shown in FIG. 15). Alternatively, when the functional element 46 includes the capacitor, at least one electrode of the capacitor may be formed of one of the conductive layers of the circuit layer 18, and/or a dielectric layer of the capacitor may be formed of one of the insulating layers of the circuit layer 18. In this case, the one of the insulating layers of the circuit layer 18 may include an inorganic material, such as silicon oxide, but not limited thereto. It is noted that installing the functional element 46 (e.g., the capacitor) in the circuit layer 18 may reduce the current path between the functional element 46 and the electronic units 16, thereby reducing signal power loss and/or reducing noise interfering the signal. When the electronic device 4 is applied to an antenna, it may help to change frequency range. In some embodiments, the functional element 46 may be formed on another substrate, and then, the substrate provided with the functional element 46 may be disposed in the circuit layer 18, but not limited thereto.

In summary, in the electronic device of the present disclosure, since the flexible member having Young's modulus less than that of the protection layer is disposed in the opening of the protection layer, the electronic device may have the bendable or flexible property, thereby improving the applications of the electronic device. In the manufacturing method of the electronic device, since the flexible member is disposed between the electronic units, the shift of the relative position of the electronic units may be reduced during the process of forming the protection layer, thereby improving the process efficiency and product quality.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a first electronic unit and a second electronic unit;
a circuit layer, wherein the first electronic unit is electrically connected to the second electronic unit through the circuit layer;
a protection layer disposed corresponding to the first electronic unit and the second electronic unit, wherein the protection layer has an opening; and
a flexible member, wherein at least a portion of the flexible member is disposed in the opening,
wherein the protection layer has a first Young's modulus, the flexible member has a second Young's modulus, and the first Young's modulus is greater than the second Young's modulus,
wherein a thermal conductivity of the protection layer is less than a thermal conductivity of the flexible member.

2. The electronic device according to claim 1, wherein the circuit layer comprises a plurality of insulating layers, one of the plurality of insulating layers has a third Young's modulus, and the first Young's modulus is greater than the third Young's modulus.

3. The electronic device according to claim 2, wherein the circuit layer comprises at least one conductive layer, the one of the plurality of insulating layers has at least one through hole, and the at least one conductive layer is electrically connected to one of the first electronic unit and the second electronic unit through the at least one through hole.

4. The electronic device according to claim 3, wherein the at least one conductive layer comprises at least one trace, and the at least one trace has an anti-break structure.

5. The electronic device according to claim 1, wherein the protection layer has a first portion corresponding to the first electronic unit and a second portion corresponding to the second electronic unit, and the flexible member separates the first portion from the second portion.

6. The electronic device according to claim 1, wherein the first electronic unit and the second electronic unit are arranged along a direction, a width of the flexible member in the direction is greater than or equal to a half of a width of one of the first electronic unit and the second electronic unit in the direction.

7. The electronic device according to claim 1, wherein the first electronic unit and the second electronic unit are arranged along a direction, a width of a portion of the protection layer located between the first electronic unit and the flexible member or located between the second electronic unit and the flexible member in the direction is less than or equal to one third of a width of the flexible member in the direction.

8. The electronic device according to claim 1, wherein the flexible element overlaps the first electronic unit and the second electronic unit.

9. The electronic device according to claim 1, wherein the flexible member surrounds the protection layer.

10. The electronic device according to claim 1, wherein the electronic device has a bendable region, and the opening is located in the bendable region.

11. The electronic device according to claim 1, wherein the circuit layer comprises a transistor electrically connected to the first electronic unit or the second electronic unit.

* * * * *